(12) United States Patent
Balasubramanian et al.

(10) Patent No.: US 10,727,363 B2
(45) Date of Patent: Jul. 28, 2020

(54) GRAPHIC LAYERS AND RELATED METHODS FOR INCORPORATION OF GRAPHIC LAYERS INTO SOLAR MODULES

(71) Applicant: Sistine Solar, Inc., Somerville, MA (US)

(72) Inventors: Senthil Balasubramanian, Cambridge, MA (US); Ido Salama, New York, NY (US); Samantha Holmes, New York, NY (US); Jody Fu, San Francisco, CA (US); Jonathan Mailoa, Cambridge, MA (US)

(73) Assignee: Sistine Solar, Inc., Somerville, MA (US)

( * ) Notice: Subject to any disclaimer, the term of this patent is extended or adjusted under 35 U.S.C. 154(b) by 0 days.

(21) Appl. No.: 16/276,256

(22) Filed: Feb. 14, 2019

(65) Prior Publication Data

US 2019/0181285 A1 Jun. 13, 2019

Related U.S. Application Data

(63) Continuation of application No. 15/004,793, filed on Jan. 22, 2016, now Pat. No. 10,256,360.
(Continued)

(51) Int. Cl.
*H01L 31/049* (2014.01)
*H01L 31/02* (2006.01)
(Continued)

(52) U.S. Cl.
CPC .............. *H01L 31/049* (2014.12); *B44F 1/06* (2013.01); *H01L 31/02* (2013.01);
(Continued)

(58) Field of Classification Search
CPC ......... H01L 31/02162; H01L 31/02164; H01L 31/02165; H01L 31/049; H01L 31/048;
(Continued)

(56) References Cited

U.S. PATENT DOCUMENTS 5,228,925 A 7/1993 Nath et al.
5,575,861 A 11/1996 Younan et al.
(Continued)

FOREIGN PATENT DOCUMENTS

CN 102104082 A 6/2011
DE 202012102494 U1 * 8/2012 ....... H01L 31/02168
(Continued)

OTHER PUBLICATIONS

English machine translation of FR 3,004,846 A1 provided by the EPO website. (Year: 2019).*
(Continued)

*Primary Examiner* — Daniel P Malley, Jr.
(74) *Attorney, Agent, or Firm* — Proskauer Rose LLP

(57) ABSTRACT

In some aspects, graphic layers for depicting a visible representation of an image along a surface of a photovoltaic module can include a plurality of substantially opaque isolated regions; and at least one substantially transparent contiguous region surrounding the substantially opaque isolated regions, wherein an outer surface of the at least one substantially transparent contiguous region comprises a matte surface finish.

19 Claims, 29 Drawing Sheets

Related U.S. Application Data

(60) Provisional application No. 62/107,136, filed on Jan. 23, 2015.

(51) Int. Cl.

| | | |
|---|---|---|
| *H01L 31/0216* | (2014.01) | |
| *H01L 31/048* | (2014.01) | |
| *H01L 31/055* | (2014.01) | |
| *H02S 20/23* | (2014.01) | |
| *B44F 1/06* | (2006.01) | |
| *H02S 99/00* | (2014.01) | |
| *B44C 5/04* | (2006.01) | |

(52) U.S. Cl.
CPC ...... *H01L 31/02162* (2013.01); *H01L 31/048* (2013.01); *H01L 31/055* (2013.01); *H02S 20/23* (2014.12); *H02S 99/00* (2013.01); *B44C 5/04* (2013.01); *Y02B 10/12* (2013.01); *Y02E 10/52* (2013.01)

(58) Field of Classification Search
CPC .... H01L 31/0481; H01L 31/0488; B44F 1/06; B44F 1/066; B32B 17/10247; B32B 17/10256; B32B 17/10266
See application file for complete search history.

(56) References Cited

U.S. PATENT DOCUMENTS

| | | | |
|---|---|---|---|
| 6,254,711 B1* | 7/2001 | Bull | .................. B44C 1/1716 |
| | | | 156/234 |
| 7,227,078 B2 | 6/2007 | Jongerden et al. | |
| 7,242,641 B2 | 7/2007 | Sato et al. | |
| 7,629,400 B2 | 12/2009 | Hyman | |
| 7,667,785 B2 | 2/2010 | Van Gorkom et al. | |
| 8,104,203 B2 | 1/2012 | MacKler | |
| 8,264,775 B2 | 9/2012 | Gilbert | |
| 8,319,093 B2 | 11/2012 | Kalkanoglu et al. | |
| 8,333,040 B2 | 12/2012 | Shiao et al. | |
| 8,404,967 B2 | 3/2013 | Kalkanoglu et al. | |
| 8,513,517 B2 | 8/2013 | Kalkanoglu et al. | |
| 8,551,280 B2 | 10/2013 | Villarreal, Jr. | |
| 8,723,015 B2 | 5/2014 | Tanaka et al. | |
| 8,826,607 B2 | 9/2014 | Shiao et al. | |
| 8,835,751 B2 | 9/2014 | Kalkanoglu et al. | |
| 2003/0035917 A1 | 2/2003 | Hyman | |
| 2005/0123707 A1* | 6/2005 | Veck | ..................... B44C 1/16 |
| | | | 428/40.1 |
| 2006/0057392 A1 | 3/2006 | Smillie et al. | |
| 2009/0000221 A1 | 1/2009 | Jacobs et al. | |
| 2009/0101192 A1 | 4/2009 | Kothari et al. | |
| 2010/0000134 A1* | 1/2010 | MacKler | ............... G09F 11/025 |
| | | | 40/492 |
| 2010/0053752 A1 | 3/2010 | Omata et al. | |
| 2011/0114178 A1 | 5/2011 | Lin et al. | |
| 2011/0200823 A1 | 8/2011 | Shiao et al. | |
| 2012/0048361 A1 | 3/2012 | Chang et al. | |
| 2012/0060434 A1 | 3/2012 | Jacobs | |
| 2013/0247985 A1 | 9/2013 | Tysak et al. | |
| 2013/0330486 A1* | 12/2013 | Shields | .................... B44F 1/10 |
| | | | 428/29 |
| 2014/0124016 A1 | 5/2014 | Iwasaki et al. | |
| 2014/0141197 A1* | 5/2014 | Hill | ......................... B41J 3/407 |
| | | | 428/137 |
| 2014/0290723 A1 | 10/2014 | Gilbert | |
| 2014/0299175 A1 | 10/2014 | Gilbert | |
| 2014/0326292 A1 | 11/2014 | Yordem et al. | |

FOREIGN PATENT DOCUMENTS

| | | | | |
|---|---|---|---|---|
| DE | 202012102494 U1 | 9/2012 | | |
| FR | 2955649 A3 | 7/2011 | | |
| FR | 3004846 A1 * | 10/2014 | ......... | G02B 27/2214 |
| FR | 3004846 A1 | 10/2014 | | |
| JP | 2012033843 A * | 2/2012 | | |
| JP | 2012033843 A | 2/2012 | | |
| WO | 2009093780 A1 | 7/2009 | | |
| WO | 2014087059 A1 | 6/2014 | | |
| WO | 2014167194 A1 | 10/2014 | | |
| WO | 2014174162 A1 | 10/2014 | | |

OTHER PUBLICATIONS

English machine translation of DE 20 2012 102 494 U1 provided by the EPO website. (Year: 2019).*

English machine translation of JP 2012-033843 A provided by the EPO website. (Year: 2019).*

* cited by examiner

630

GRAPHIC LAYERS AND RELATED METHODS FOR INCORPORATION OF GRAPHIC LAYERS INTO SOLAR MODULES

RELATED APPLICATIONS

This application is a continuation of U.S. patent application Ser. No. 15/004,793, filed Jan. 22, 2016, which claims priority under 35 U.S.C. § 119(e) to U.S. Provisional Patent Application Ser. No. 62/107,136, filed Jan. 23, 2015, and entitled GRAPHIC LAYERS AND RELATED METHODS FOR INCORPORATION OF GRAPHIC LAYERS INTO SOLAR MODULES; the contents of which are incorporated herein by reference in their entirety for all purposes.

FIELD OF THE INVENTION

The present invention generally relates to graphic layers and related methods for incorporation of graphic layers into solar modules.

BACKGROUND

The benefits of solar energy as a clean, environmentally friendly, fossil-fuel-free energy source are known. In recent years, the technology has also become increasingly affordable thanks to improvements in energy conversion efficiency, reductions in manufacturing costs, and well-structured government incentive schemes such as the federal tax credits and tradable renewable energy certificates in the United States. However, since the earliest deployments of solar in the post WWII years, the visual appearance of solar panels has not changed significantly, with the overwhelming majority of the panels having a generally black or dark blue color. Traditionally, darker colors were used to increase efficiency and, given the historically high cost structure of solar, every basis point in efficiency gain made a significant impact on the economic payback. However, methods for altering the visual appearance of solar panels are now desirable.

SUMMARY OF INVENTION

The present invention relates to graphic layers and related methods for incorporation of graphic layers into solar modules.

In one aspect, graphic layers (e.g., graphic layers for forming an image and/or a pattern visible on a light-incident surface of a photovoltaic layer of a photovoltaic module) is provided. In some embodiments, the graphic layer comprises a plurality of substantially opaque isolated regions and at least one substantially transparent contiguous region surrounding the substantially opaque isolated regions, wherein at least a portion of the substantially opaque isolated regions form an image and/or a pattern having a resolution in the range of about 5 opaque regions per inch (RPI) to about 300 opaque RPI, wherein the graphic layer has a transparency level in the range of about 50% to about 95%.

In some embodiments, the graphic layer comprises a plurality of substantially opaque isolated regions and at least one substantially transparent contiguous region surrounding the substantially opaque isolated regions, wherein at least a portion of the substantially opaque isolated regions are offset from neighboring substantially opaque regions by an offset angle in the range of about 5 degrees to about 85 degrees.

In some embodiments, the graphic layer comprises a plurality of substantially opaque isolated regions and at least one substantially transparent contiguous region surrounding the substantially opaque isolated regions, wherein at least a portion of the substantially opaque isolated regions comprise at least a first layer comprising at least a first ink and/or at least a second layer comprising at least a second ink.

In some embodiments, the graphic layer comprises an image and/or a pattern and/or one or more colors that are different from a color of a light-incident surface of a photovoltaic layer of the photovoltaic module, and a plurality of colored photovoltaic layers, wherein the graphic layer and the plurality of colored photovoltaic layers are laminated together so that the graphic layer and the plurality of colored photovoltaic cells together create an image and/or a pattern on the photovoltaic module.

In another aspect, photovoltaic modules are provided. In some embodiments, the photovoltaic module comprises a graphic layer comprising a plurality of substantially opaque isolated regions and at least one substantially transparent contiguous region surrounding the substantially opaque isolated regions, wherein at least a portion of the substantially opaque isolated regions form an image and/or a pattern, and a photovoltaic layer, wherein the graphic layer is positioned in front of a light-incident surface of the photovoltaic layer.

In some embodiments, the photovoltaic module comprises a graphic layer comprising a plurality of substantially opaque isolated regions and at least one substantially transparent contiguous region surrounding the substantially opaque isolated regions, wherein at least a portion of the substantially opaque isolated regions form an image and/or a pattern, wherein at least a portion of the substantially opaque isolated regions are offset from neighboring substantially opaque regions by an offset angle in the range of about 3 degrees to about 60 degrees, and a photovoltaic layer, wherein the graphic layer is positioned in front of a light-incident surface of the photovoltaic layer.

In some embodiments, the photovoltaic module comprises a graphic layer comprising a plurality of substantially opaque isolated regions and at least one substantially transparent contiguous region surrounding the substantially opaque isolated regions, wherein at least a portion of the substantially opaque isolated regions form an image and/or a pattern, wherein at least a portion of the substantially opaque isolated regions comprise at least a first layer comprising at least a first ink and/or at least a second layer comprising at least a second ink, and a photovoltaic layer, wherein the graphic layer is positioned in front of a light-incident surface of the photovoltaic layer.

In some embodiments, the photovoltaic module comprises a graphic layer comprising an image and/or a pattern and/or one or more colors that are different from a color of a light-incident surface of a photovoltaic layer of the photovoltaic module and a plurality of colored photovoltaic layers, wherein the graphic layer and the plurality of colored photovoltaic layers are laminated together so that the graphic layer and the plurality of colored photovoltaic layers together create an image and/or a pattern on the photovoltaic module.

In another aspect, methods of making a graphic layer for a photovoltaic module is provided. In some embodiments, the method comprises forming a first plurality of isolated regions on a substantially transparent layer to produce a printed layer, forming a second plurality of isolated regions on at least a portion of the first plurality of isolated regions in a pre-determined pattern to produce and/or complete an image and/or a pattern on the printed layer to produce the graphic layer.

In some embodiments, the method comprises determining a series of image forming parameters of a pre-determined pattern based upon a desired transparency level and/or RPI, modifying an original image based upon the series of image forming parameters of the pre-determined pattern such that the modified image comprises a plurality of isolated regions arranged in the pre-determined pattern, forming the plurality of isolated regions on a substantially transparent layer to produce and/or complete an image and/or a pattern to produce the graphic layer.

In another aspect, methods of making photovoltaic modules are provided. In some embodiments, the method comprises forming a first plurality of isolated regions on a substantially transparent layer, forming a second plurality of isolated regions on at least a portion of the first plurality of isolated regions to form a graphic layer, wherein at least a portion of the second plurality of isolated regions form an image and/or a pattern, and positioning the graphic layer in front of a light-incident surface of a photovoltaic layer.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

Figure 1A:
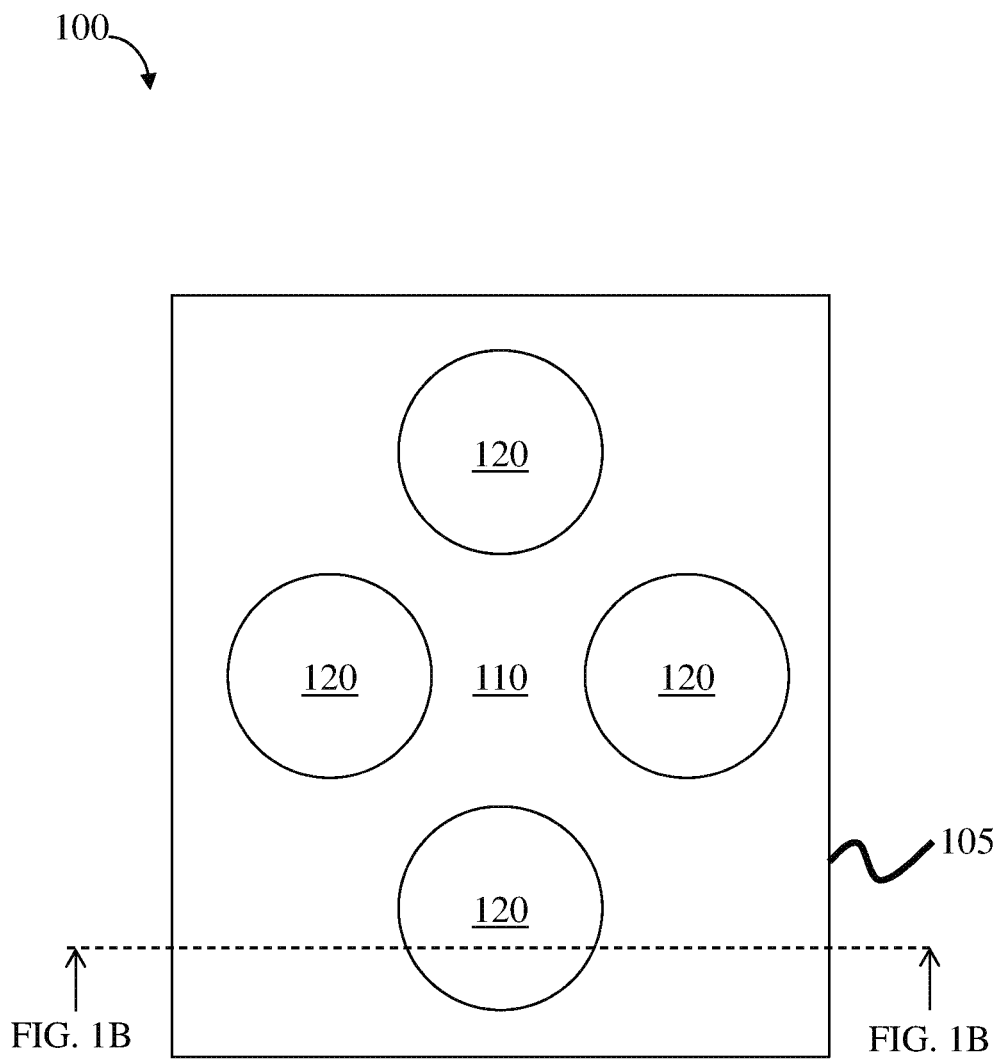
FIGS. 1A-1D are schematic representations of a graphic layer including a contiguous region and a plurality of isolated regions, according to one set of embodiments.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention.

DETAILED DESCRIPTION OF INVENTION

The present invention generally relates to graphic layers and related methods. In some cases, photovoltaic modules comprising a graphic layer are provided. The graphic layers may form an image and/or a pattern (e.g., on the surface of, and/or visible when viewing the surface of, a photovoltaic module) with a plurality of isolated opaque regions and a transparent contiguous region (i.e. at least one transparent contiguous region) surrounding the isolated opaque regions. Photovoltaic modules comprising such graphic layers may offer several advantages over traditional photovoltaic modules including enhancing and broadening the aesthetic appearance of solar panels (e.g., in order to significantly increase their widespread adoption), increasing the attractiveness and desirability of solar panels to the general consumer (e.g., creating additional value beyond alternative energy including, for example, boosting the resale value of homes and/or buildings utilizing such solar panels, or generating additional income streams by using the graphic layers integrated into such solar panels as advertising media). While previous attempts have been made to alter the visual appearance of photovoltaic modules, including the manufacture of crystalline solar cells of varying colors, such methods are often limited in the range of colors and/or visual effect produced, are not generally scalable, are expensive (e.g., typically involving expensive techniques such as atomic layer deposition or chemical vapor deposition or expensive materials such as rare dyes or pigments or both), and/or are limited to few select applications. The use of graphic layers as described herein may, in certain embodiments, provide inexpensive, scalable, and customizable (e.g., in color, size, and/or image complexity) methods and devices for improving the appearance of photovoltaic modules as compared to typical methods known in the art. Furthermore, certain embodiments of photovoltaic modules comprising graphic layers of the present invention may also demonstrate greater levels of energy efficiency (e.g., transmission of light to the photovoltaic module) as compared to alternative methods for altering the appearance of such modules conventional in the art.

In some embodiments, a photovoltaic module comprises a graphic layer. In certain embodiments, the graphic layer comprises a plurality of isolated regions (e.g., substantially opaque isolated regions) and a contiguous region (e.g., at least one transparent contiguous region). The isolated regions may comprise, in some cases, a base layer and an image layer. At least a portion of the plurality of isolated regions may form a recognizable image, while in certain embodiments, at least some substantially opaque regions may be included not for the purpose of, or not primarily for the purpose of, contributing to a recognizable image, but rather as masking regions, lines, etc. to cover otherwise visible components/features (e.g. wires/connectors, etc.) whose appearance without such masking would be less desirable to the overall appearance of the image on the graphic layer.

Figure 1B:
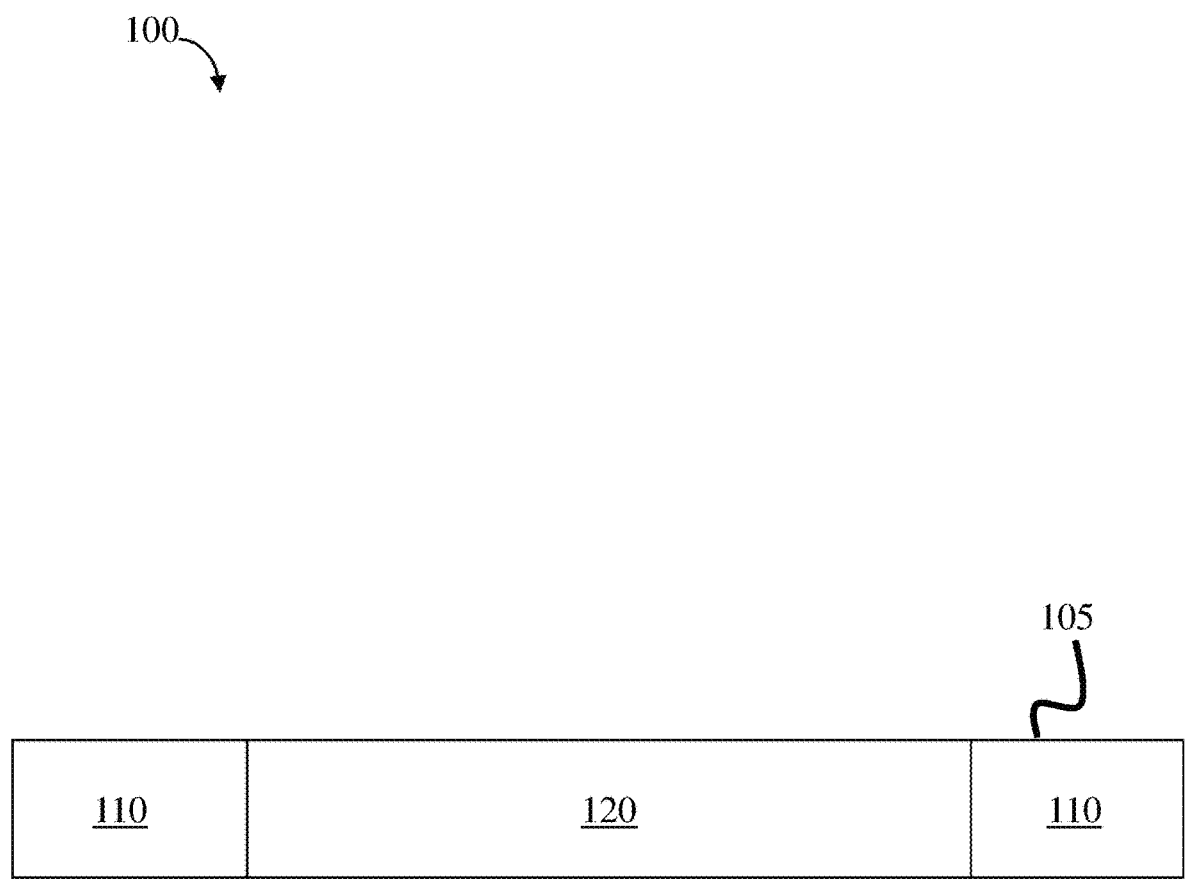
Figure 1C:
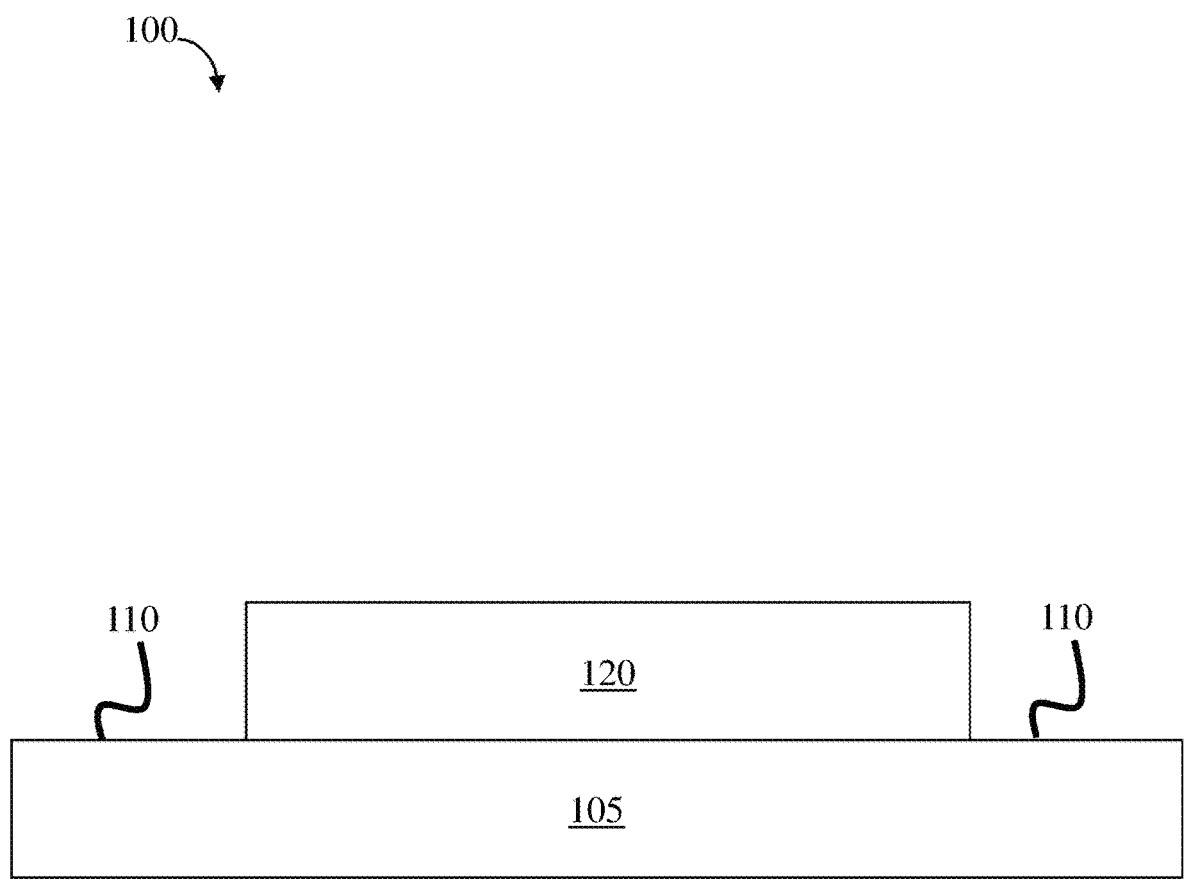
Figure 1D:
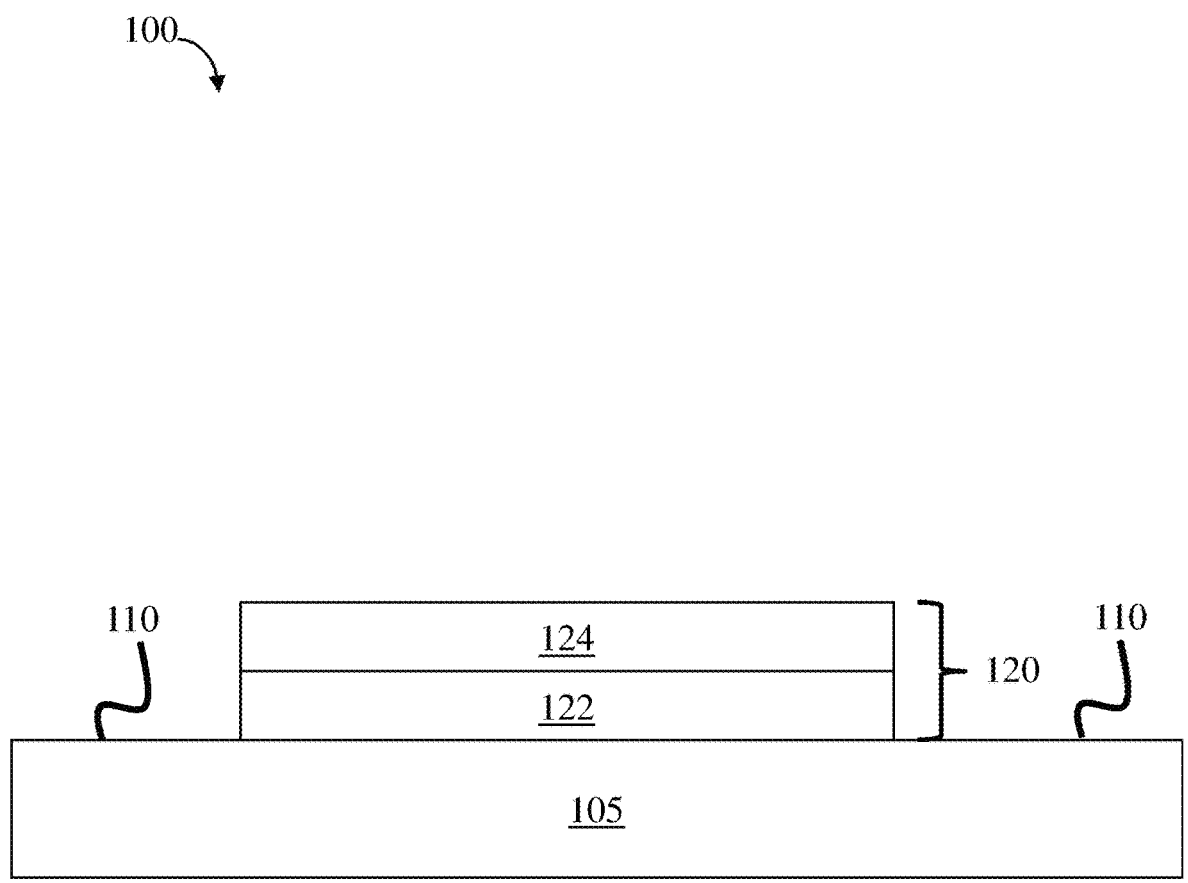

As illustrated in FIG. 1A, graphic layer 100 generally comprises a contiguous layer 105 comprising a contiguous region 110 surrounding a plurality of isolated regions 120. In some embodiments, as illustrated in FIG. 1B (a cross-sectional view of graphic layer 100) the plurality of isolated regions 120 and contiguous regions 110 are within the same layer and together form contiguous layer 105. In some embodiments, referring now to FIG. 1C, isolated regions 120 are disposed on only a portion of contiguous layer 105 leaving exposed contiguous regions 110. Each isolated region 120 may itself comprise a plurality of layers. In some embodiments, each isolated region comprises at least one base layer and at least one image layer. For example, as illustrated in FIG. 1D, isolated region 120 comprises base layer 122 and image layer 124. Each isolated region may comprise the same or different base layer(s) and/or image layer(s).

Modification of Original Image to Produce Graphic Layer

Figure 2A:
FIG. 2A is an exemplary image which may be used for forming a graphic layer according to one set of embodiments.
Figure 2B:
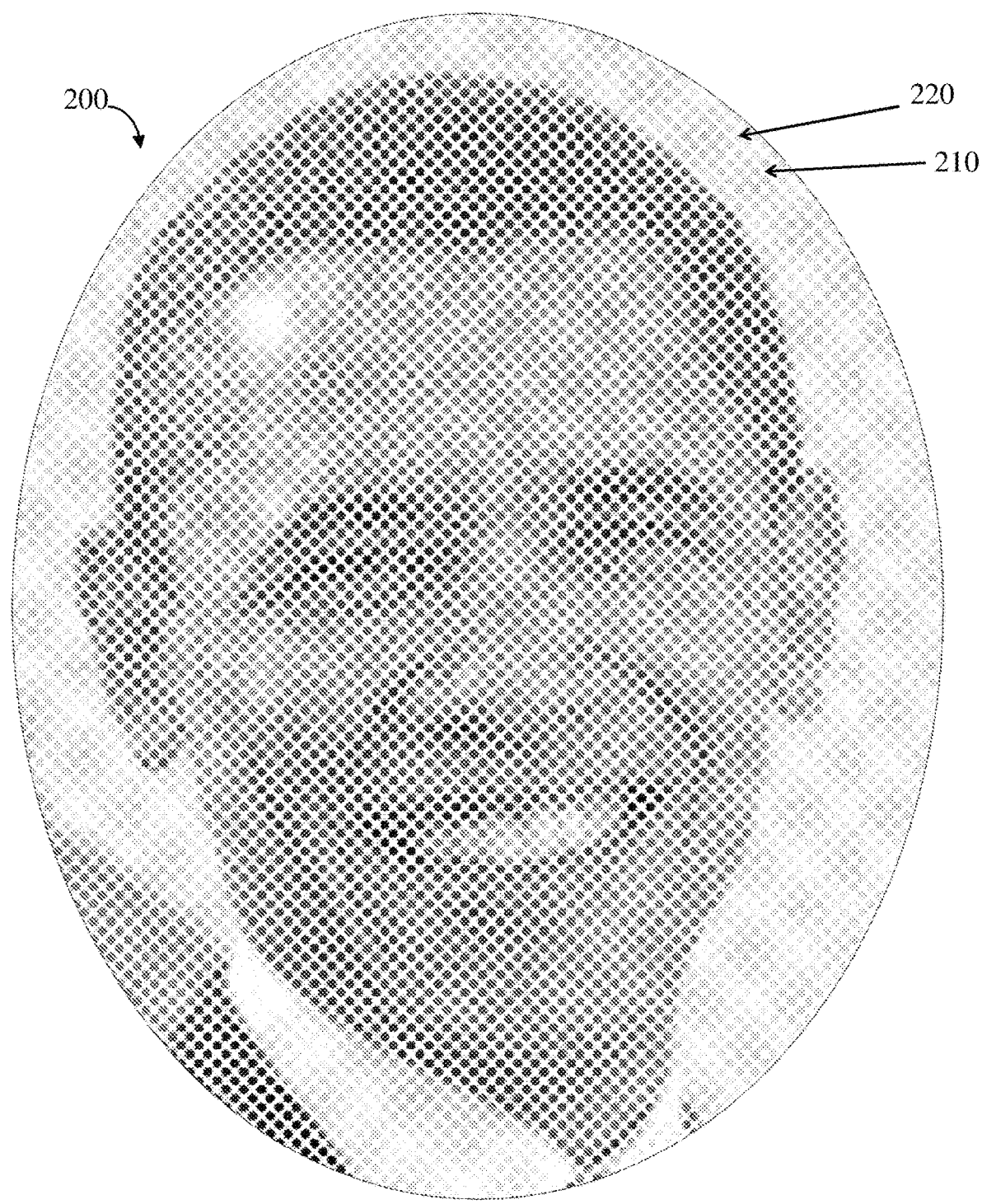
FIGS. 2B-2E are schematic representations of the image in FIG. 2A after modification to be at least partially transparent, according to some embodiments.

In certain embodiments, each isolated region is generally substantially opaque. Substantially opaque in the context of isolated regions refers to isolated region(s) whose opacity to at least certain visible wavelengths exceeds that of the contiguous region(s) surrounding the isolated region(s). As described in more detail below, in certain embodiments, some or all of the substantially opaque isolated regions may be substantially completely or almost completely opaque (e.g. having an average opacity over the area of the isolated region(s) of at least 90%, such as within the range of 90% to 100% opacity), while in other embodiments, at least some of the substantially opaque isolated regions are at more transparent (e.g. having an average opacity over the area of the region(s) of at least 50%, such as within the range of 50% to 90% opacity). Generally, in order to form a visually discernable image, at least some, many, most, or each substantially opaque region will be less transparent than the contiguous region(s), depending on the visual effect desired. The plurality of isolated regions generally forms an image and/or pattern. For example, FIG. 2A depicts an exemplary original image as may be used for forming a graphic layer. In some such images, the entirety of the original image may be substantially opaque. In some embodiments, the original image and/or pattern (e.g., the exemplary original image of FIG. 2A) is modified such that it is now at least partially transparent. For example, as illustrated in FIG. 2B, graphic layer 200 comprises a plurality of substantially opaque isolated regions 220 and a contiguous transparent region 210. Substantially opaque isolated regions 220 generally correspond to at least a portion of the original image. In some such embodiments, light that is incident on the isolated regions is substantially reflected while light that is incident on the contiguous transparent region is substantially transmitted through the graphic layer. That is to say, the plurality of substantially opaque isolated regions generally forms an image and/or pattern derived from the original image and/or pattern. The pattern may be a pre-determined pattern (e.g., formed from a clipping mask), as described in more detail in the Examples.

Isolated Regions

Surface Area

The plurality of isolated regions generally occupies a particular surface area of the overall image forming portion of the graphic layer. Those skilled in the art would understand that the image forming portion generally comprises a plurality of isolated regions and a contiguous region, but may not include regions of a contiguous layer which, for example, are substantially free of any isolated regions. That is to say, the surface area that is covered by the isolated regions is generally expressed as a percentage of the total surface area of the image forming portion of the graphic layer (e.g., the total surface area of the graphic layer comprising a plurality of isolated regions and at least one contiguous region) and, for embodiments comprising isolated regions that are substantially opaque, equates to the percentage of the image that is substantially opaque (e.g., serving as a measure of the opacity of the image). Conversely, the total surface area that is covered by the transparent contiguous region(s) expressed as a percentage of the total surface area of the image forming portion of the graphic layer equates to the percentage of the image that is substantially transparent (e.g., serving as a measure of the transparency level of the image). For example, in some embodiments, the isolated regions occupy a surface area of between about 1% and about 80%, (e.g., between about 5% and about 50%, between about 10% and about 20%) of the total surface area of the graphic layer (e.g., the image forming portion of the graphic layer). For example, in some embodiments, the isolated regions occupy a surface area of at least about 1%, at least about 5%, at least about 10%, at least about 20%, at least about 30%, at least about 40%, at least about 50%, at least about 60%, or at least about 70% of the total surface area of the graphic layer. In certain embodiments, the isolated regions occupy a surface area of less than or equal to about 80%, less than or equal to about 70%, less than or equal to about 60%, less than or equal to about 50%, less than or equal to about 40%, less than or equal to about 30%, less than or equal to about 20%, or less than or equal to about 10%. Combinations of the above-referenced ranges are also possible (e.g., between about 5% and about 50%, between about 10% and about 20%). Other ranges are also possible.

Surface Area Relating to Transparency Level

Further, those skilled in the art will understand that different degrees of light transmission through the graphic layer can be achieved by altering the sizes of the isolated regions, the number of isolated regions within a given surface area, the degree of opacity of the isolated regions (discussed further below), and/or the spacing between the isolated regions. For instance, the same original image may be modified such that the isolated regions occupy a surface area of about 5%, corresponding to about 95% of the incident light on the graphic layer being transmitted through the graphic layer for embodiments in which the isolated region(s) are substantially completely opaque (i.e. essentially 100%). In some embodiments, the graphic layer may have an average overall transparency level (e.g., corresponding to the surface area not occupied by substantially completely opaque isolated regions expressed as a percentage of the total surface area) ranging between about 50% and about 99%. For example, in some embodiments, the graphic layer may have an average transparency level of at least about 50%, at least about 60%, at least about 70%, at least about 80%, at least about 90%, at least about 95%, or at least about 99%. For embodiments in which the isolated regions are substantially opaque but have a higher level of transparency than the substantially completely opaque isolated regions in the discussion above, the overall transparency of the graphic layer will be a function of the degree of opacity of the isolated regions as well as their percent coverage of the surface area of the graphic layer. This calculation is presented in the section discussing isolated region opacity below.

Figure 2C:
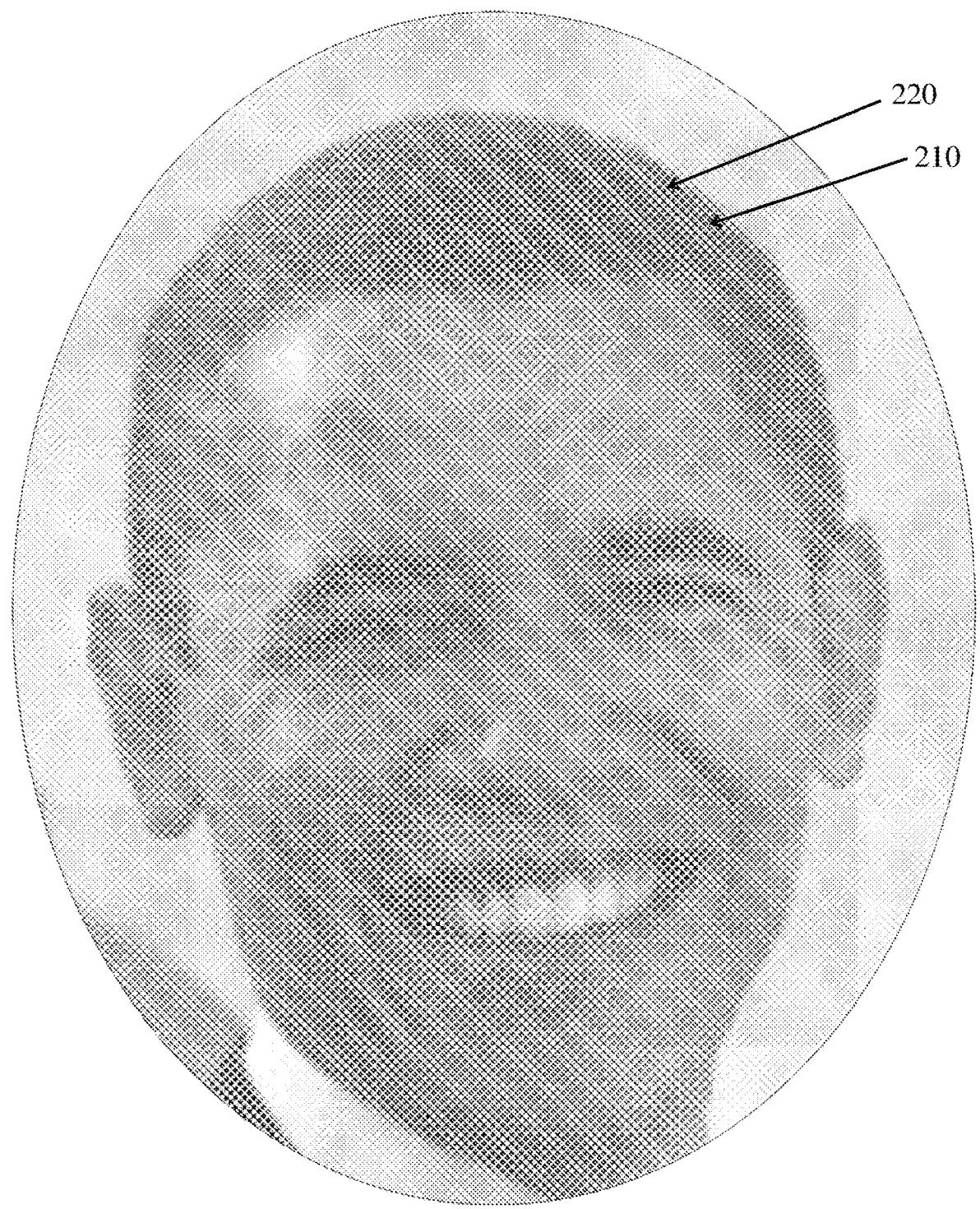
Figure 2D:
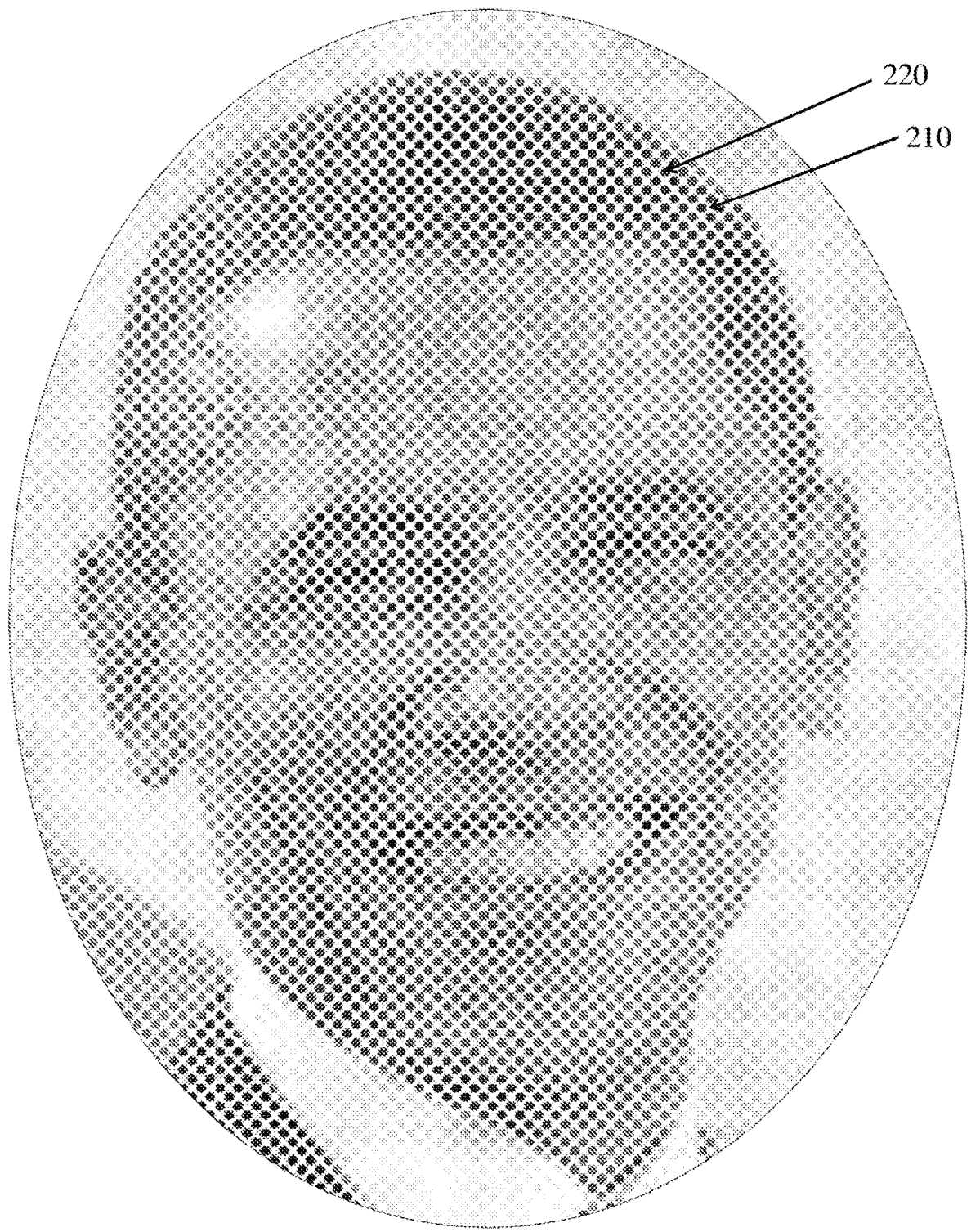
Figure 2E:
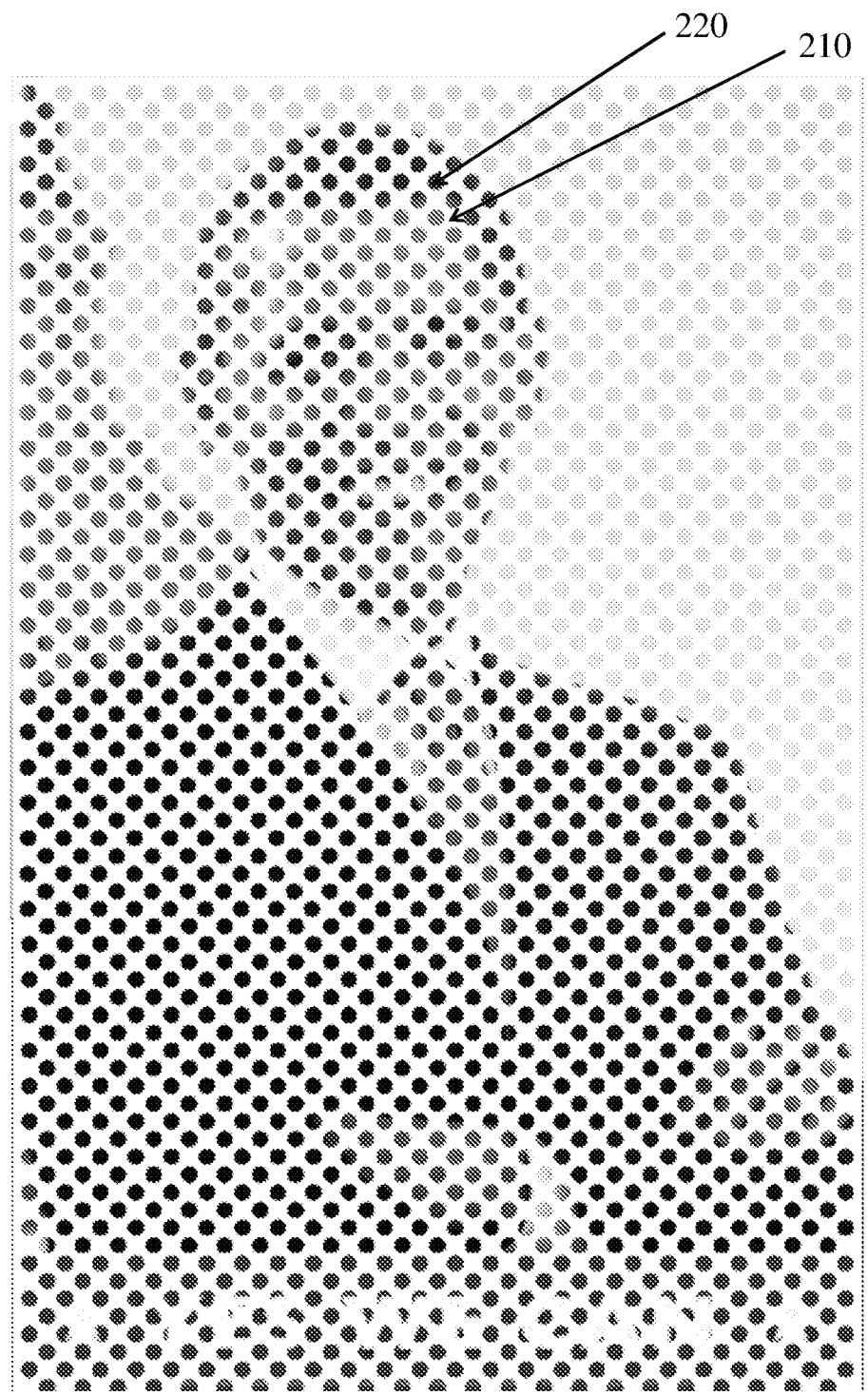

The number of, size of, shape of, and/or spacing between, isolated regions may affect or determine the overall transparency level of the graphic layer. For example, as illustrated in FIGS. 2C-2E, by altering the number of the isolated regions 220, the size of the isolated regions 220, and/or the spacing 210 between the isolated regions 220, different image resolutions and/or transparency levels may be achieved. In exemplary FIGS. 2C-2E, the total surface area occupied by all the isolated regions, expressed as a percentage of the total surface area of the image, is the same. That is to say, the transparency level of all three exemplary figures is the same while other image parameters (e.g., number of isolated regions, size of isolated regions, spacing between isolated regions, and/or image resolutions) are different. Such modifications may allow for adjustment of image resolutions based on the distance of a viewer from the image. For example, in cases where the graphic layer is on a rooftop or on a billboard and the viewer is at street level, the graphic layer may be of lower resolution (e.g., fewer isolated regions, and/or isolated regions spaced further apart and/or isolated regions having relatively smaller sizes) than a graphic layer on a piece of street furniture (e.g., a park bench, a bus shelter, a carport) where the viewer is, for example, standing closer to the graphic layer. Graphic layer resolutions are described in more detail below. Conversely, it will be evident that by adjusting the same parameters, one may also achieve different versions of an image wherein each has a different transparency level while maintaining the same image resolution. Further, it will be evident, that by adjusting the same parameters, one may also achieve different versions of an image wherein each has a different transparency level as well a different image resolution.

Shape

As described above, the isolated regions may have any suitable shape. While the isolated regions of FIGS. 1A-2E are generally illustrated as substantially circular, those skilled in the art would understand that any suitable shape may be used. Each of the isolated regions may have the same or different shape. Non-limiting examples of suitable shapes include substantially circular (e.g., circular, elliptical, capsule-like), substantially linear (e.g. thin lines or stripes), polygonal (e.g., triangular, square, rectangular, trapezoidal, hexagonal, or the like). In some cases, the isolated regions may be irregularly shaped. Those skilled in the art would be capable of selecting suitable shapes for the isolated regions based upon desired image quality/visual effect as guided by the teachings of this specification.

Size

Each of the isolated regions may have a particular size (e.g., largest cross-sectional dimension). The plurality of isolated regions may, in some cases, all have substantially the same largest size. In some embodiments, the size of each isolated region may be different. In some embodiments, each of the isolated regions may have a largest cross-sectional dimension ranging between about 20 microns (about 0.0008 inches) and about 10160 microns (about 0.4 inches), or between about 20 microns (about 0.0008 inches) and about 4064 microns (about 0.16 inches). In certain embodiments, each of the isolated regions may have a largest-cross sectional dimension of at least about 20 microns, at least about 40 microns, at least about 60 microns, at least about 80 microns, at least about 90 microns, at least about 100 microns, at least about 200 microns, at least about 500 microns, at least about 1000 microns, at least about 1250 microns, at least about 1270 microns, at least about 1500 microns, at least about 2000 microns, at least about 3000 microns, at least about 4000 microns, at least about 5000 microns, at least about 5080 microns, or at least about 10000 microns. In some embodiments, each of the isolated regions may have a largest cross-sectional dimension of less than or equal to about 10160 microns, less than or equal to about 5080 microns, less than or equal to about 5000 microns, less than or equal to about 4064 microns, less than or equal to about 4000 microns, less than or equal to about 3000 microns, less than or equal to about 2000 microns, less than or equal to about 1500 microns, less than or equal to about 1270 microns, less than or equal to about 1250 microns, less than or equal to about 1000 microns, less than or equal to about 500 microns, less than or equal to about 200 microns, less than or equal to about 100 microns, less than or equal to about 90 microns, less than or equal to about 80 microns, less than or equal to about 60 microns, or less than or equal to about 40 microns. Combinations of the above-referenced ranges are also possible (e.g., between about 20 microns and about 10160 microns, between about 20 microns and about 4064 microns, between about 90 microns and about 1270 microns, between about 90 microns and about 5080 microns, between about 80 microns and about 1200 microns). Other ranges are also possible.

Spacing

Figure 5:
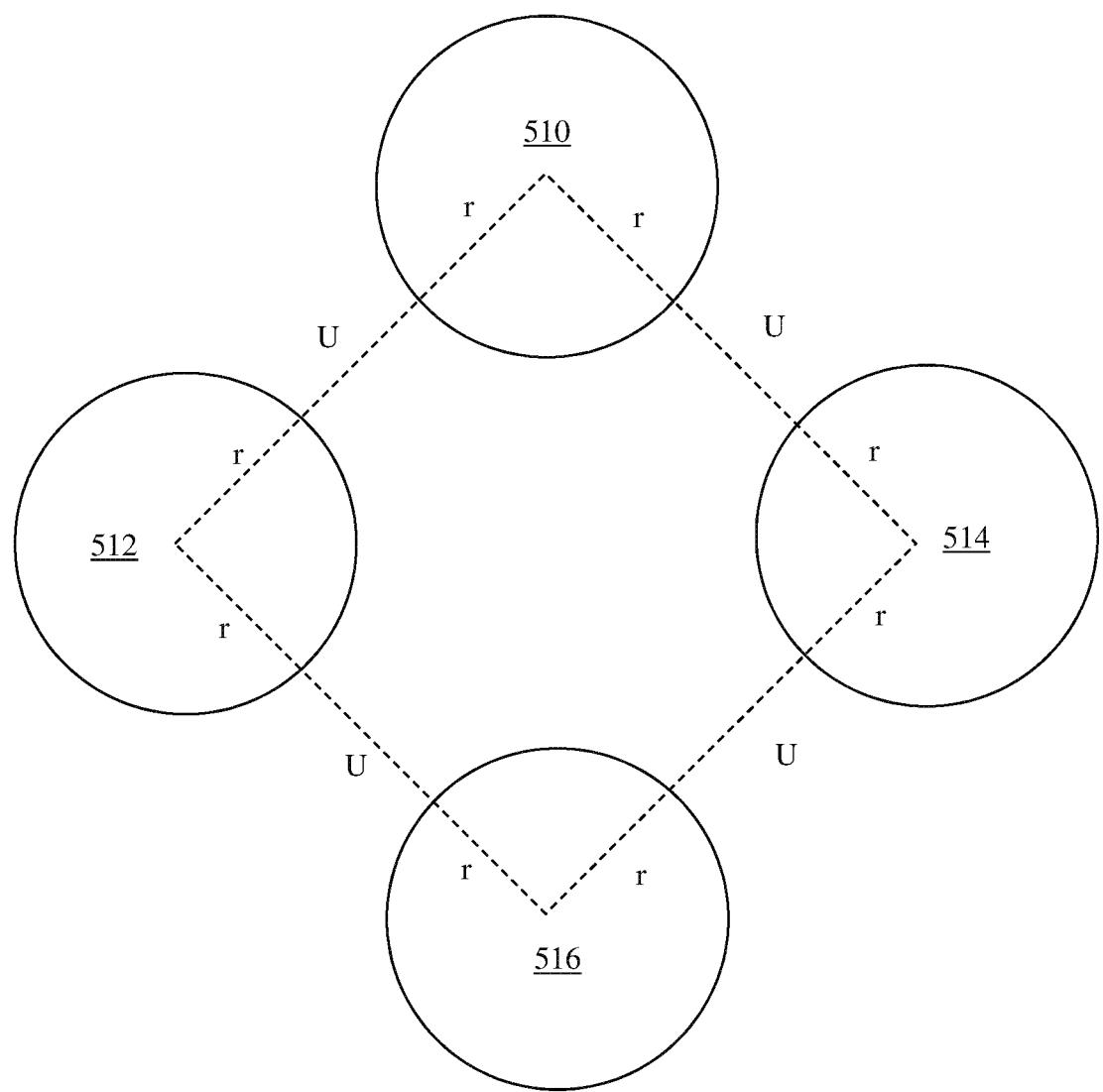
FIG. 5 is a schematic illustration of the distance between neighboring isolated regions, according to one set of embodiments.

As illustrated in FIG. 5, isolated regions 510, 512, 514, and 516 each has a shortest distance between neighboring isolated regions. In some embodiments, isolated regions 510, 512, 514, and 516 each has a shortest distance between neighboring isolated regions defined as the shortest distance, U, connecting the perimeters of the closest neighboring isolated regions—often convenient for irregularly shaped isolated regions and/or isolated regions with large aspect ratios. In some embodiments, isolated regions 510, 512, 514, and 516 each has a shortest distance between neighboring isolated regions defined as the shortest distance, U+2r (where r is half of the largest cross-sectional dimension of the isolated region), connecting the geometric center points of the closest neighboring isolated regions—e.g. as shown in FIG. 5 for substantially circular isolated regions 510, 512, 514, 516. In some such embodiments, each U (or U+2r) may be the same or different. That is to say, the shortest distances between neighboring isolated regions may, in some cases, be uniform (i.e. having each U or U+2r be the same as shown in FIG. 5). In some embodiments, the shortest distances between neighboring isolated regions is different (i.e.

wherein each U or U+2r is not necessarily the same). In certain embodiments, the average shortest distance between neighboring isolated regions (i.e. the average of the shortest distances connecting the perimeters of the closest neighboring isolated regions or the average of the shortest distances connecting the geometric center points of the closest neighboring isolated regions) may be between about 1.25 times the average largest cross-sectional dimension of the isolated regions and about 4 times the average largest cross-sectional dimension of the isolated regions. In some cases, the average shortest distance between two neighboring isolated regions is at least about 1.25 times, at least about 1.5 times, at least about 1.75 times, at least about 2 times, at least about 2.5 times, at least about 3 times, or at least about 3.5 times the average largest cross-sectional dimension of the isolated regions. In certain embodiments, the average shortest distance between two neighboring isolated regions is less than or equal to about 4 times, less than or equal to about 3.5 times, less than or equal to about 3 times, less than or equal to about 2.5 times, less than or equal to about 2 times, less than or equal to about 1.75 times, or less than or equal to about 1.5 times the average largest cross-sectional dimension of the isolated regions. Combinations of the above referenced ranges are also possible (e.g., between about 1.25 times and about 4 times, between about 2 times and about 3 times). Other ranges are also possible.

Image Resolution

Accordingly, the graphic layer comprising a plurality of isolated regions may have a particular resolution. Resolution may be described, in some cases, as the number of isolated regions per unit distance (e.g., regions per inch (RPI), which conflates to the commonly used dots per inch (DPI) for images formed from substantially circular isolated regions). In some embodiments, the graphic layer has a resolution of between about 5 RPI and about 300 RPI. In certain embodiments, the graphic layer has a resolution of at least about 5 RPI, at least about 10 RPI, at least about 15 RPI, at least about 20 RPI, at least about 25 RPI, at least about 50 RPI, at least about 75 RPI, at least about 100 RPI, at least about 150 RPI, at least about 200 RPI, or at least about 250 RPI. In some embodiments, the graphic layer has a resolution of less than or equal to about 300 RPI, less than or equal to about 250 RPI, less than or equal to about 200 RPI, less than or equal to about 150 RPI, less than or equal to about 100 RPI, less than or equal to about 75 RPI, less than or equal to about 50 RPI, less than or equal to about 25 RPI, less than or equal to about 20 RPI, less than or equal to about 15 RPI, or less than or equal to about 10 RPI. Combinations of the above-referenced ranges are also possible (e.g., between about 5 RPI and about 300 RPI, between about 10 RPI and about 100 RPI). Other ranges are also possible.

Pattern and Orientation of Isolated Regions

Figure 3A:
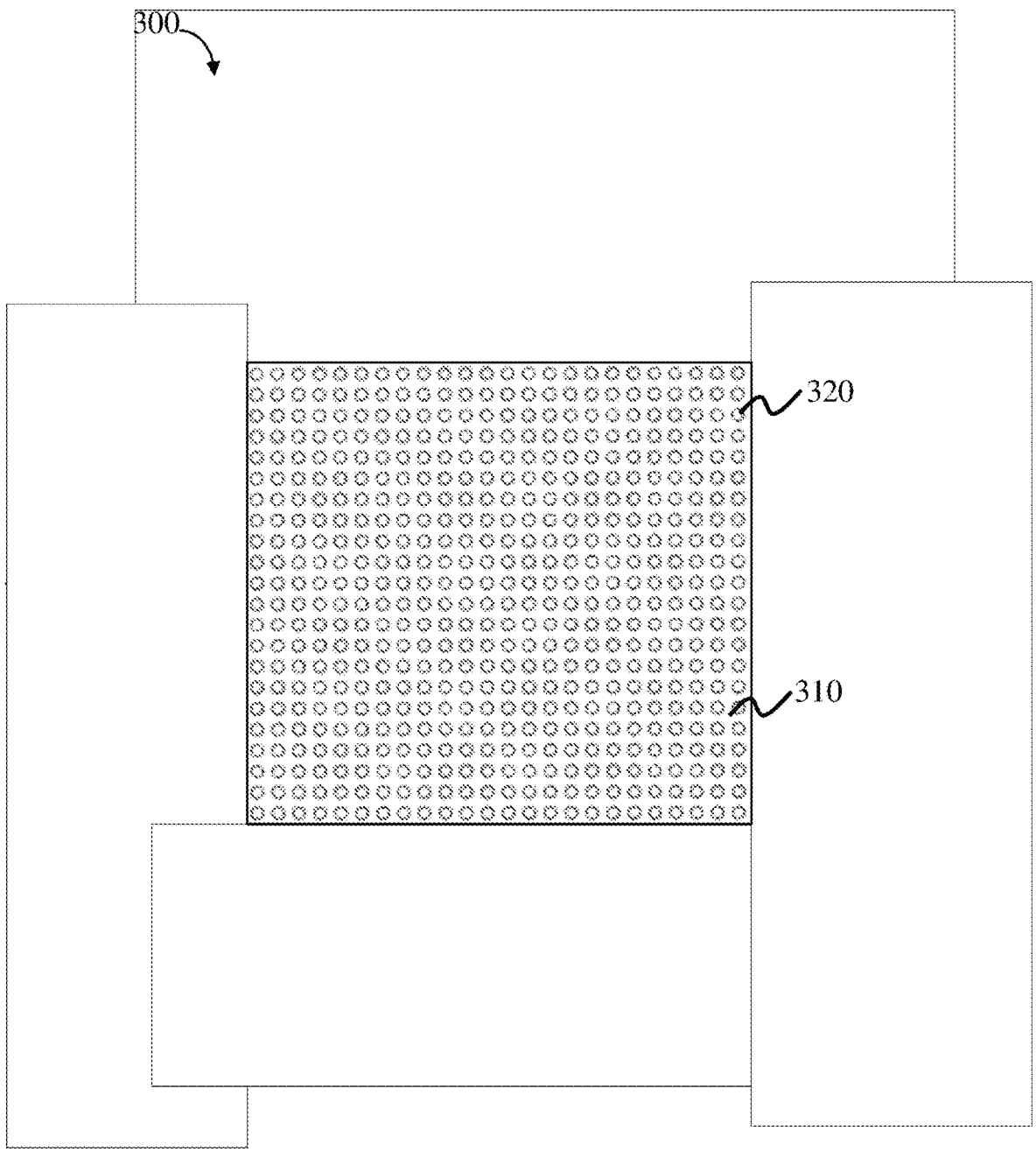
FIGS. 3A-3B are schematic representations of patterns of isolated regions, according to one set of embodiments.
Figure 3B:
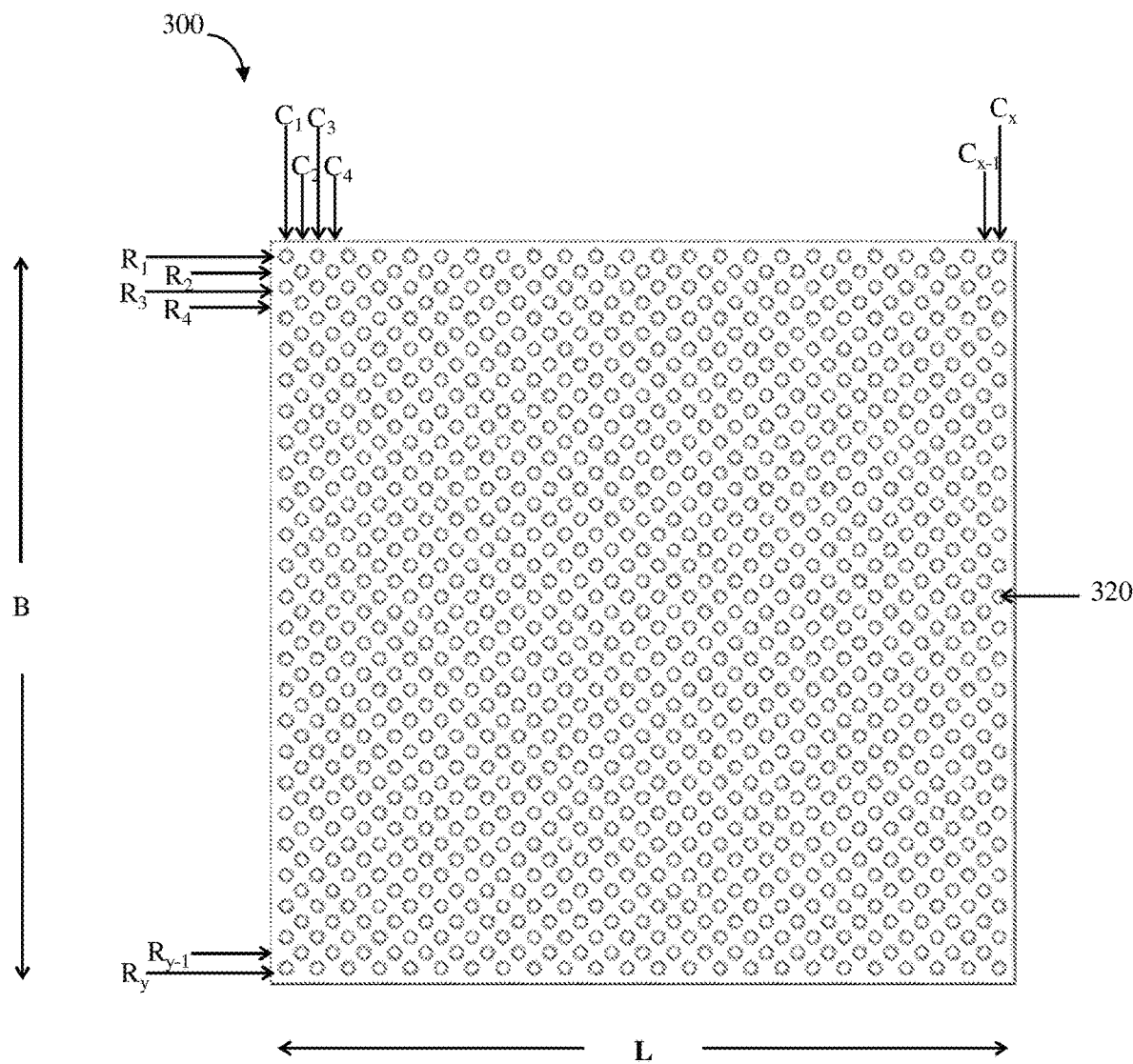
Figure 4:
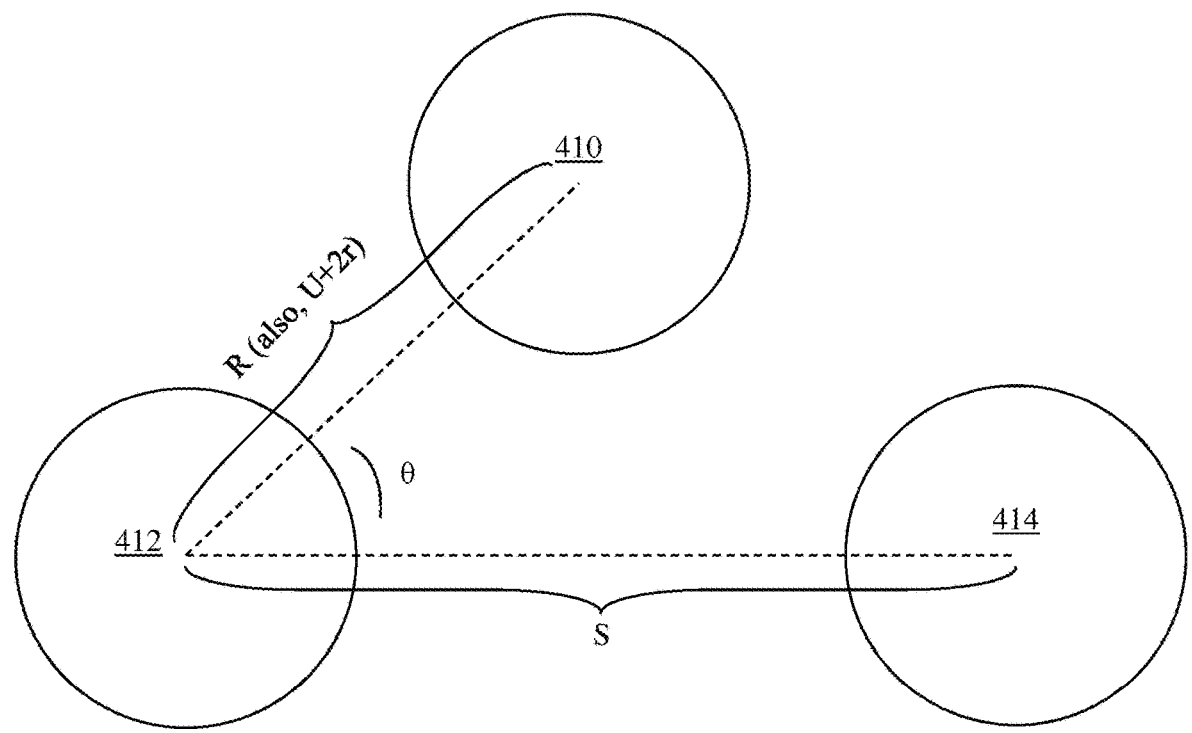
FIG. 4 is a schematic illustration of the offset angle between isolated regions, according to one set of embodiments.

At least a portion of the plurality of isolated regions may form a particular pattern. For example, as illustrated in FIG. 3A, isolated regions 320 may form a substantially aligned pattern of rows and columns of isolated regions. The term aligned as described herein is given its ordinary definition in the art and generally refers to arranging three or more isolated regions such that a substantially straight line passing through three or more isolated regions intersects (at least approximately) with a geometric center of each of the isolated regions. In some embodiments, the substantially aligned patterns of rows and columns may be offset and/or orientated (e.g., relative to the vertical orientation of the original image as illustrated, for example, in FIG. 2A). That is to say, in some cases, isolated regions may be offset from neighboring isolated regions when viewed from a particular angle (e.g., a vertical angle such as a person standing vertically directly in front of the graphic layer). In some such embodiments, at least a portion of the isolated regions are offset from neighboring isolated regions by an offset angle in the range of about 3 degrees to about 60 degrees. For example, as illustrated in exemplary isolated regions 320 in FIG. 3B, at least a portion of the isolated regions 320 are offset from neighboring isolated regions by an offset angle of about 45 degrees. As illustrated in FIG. 4, the offset angle may be determined by measuring the angle between three or more isolated regions. The offset angle between three or more isolated regions may be determined by, for example, measuring the angle ($\theta$, theta) between a line intersecting the geometric centers of first isolated region 410 and second isolated region 412 (line R), and a line substantially parallel to a vertical or horizontal (as illustrated) orientation direction of the original image intersecting the geometric centers of second isolated region 412 and third isolated region 414 (line S). In some embodiments, at least a portion of the isolated regions are offset from neighboring isolated regions by an offset angle of between about 3 degrees and about 60 degrees, between about between about 10 degrees and about 60 degrees, between about 15 degrees and about 60 degrees, between about 20 degrees and about 60 degrees, between about 25 degrees and about 60 degrees, between about 30 degrees and about 60 degrees, between about 35 degrees and about 55 degrees, between about 40 degrees and about 50 degrees, or of about 45 degrees. Other ranges are also possible.

Having an offset angle (e.g., of between about 40 degrees and about 50 degrees) may improve the image rendition/recognition capability of a plurality of isolated regions as compared to a plurality of isolated regions having no substantial offset angle. That is to say, a plurality of isolated regions having an offset angle may permit a viewer to recognize the modified image as being substantially similar to the original image (e.g., isolated regions which comprise a modified image of a human face may be more recognizable when having an offset angle as compared to substantially no offset angle). In some such embodiments (wherein the plurality of isolated regions have an offset angle), isolated regions with a smaller size and/or decreased distances between isolated regions may be used to result in a similarly recognizable image as compared to, for example, larger and/or less closely spaced isolated regions with substantially no offset angle.

In some embodiments, at least a portion of the plurality of isolated regions is substantially offset with respect to the vertical or horizontal orientation direction of the original image being rendered. That is to say, the plurality of isolated regions may not form a particular pattern of rows and columns aligned with the vertical or horizontal orientation direction of the original image. In some such embodiments, the angle ($\theta$, theta) may be different for each set of neighboring isolated regions.

Base Layer and Image Layer of Isolated Regions

Figure 7:
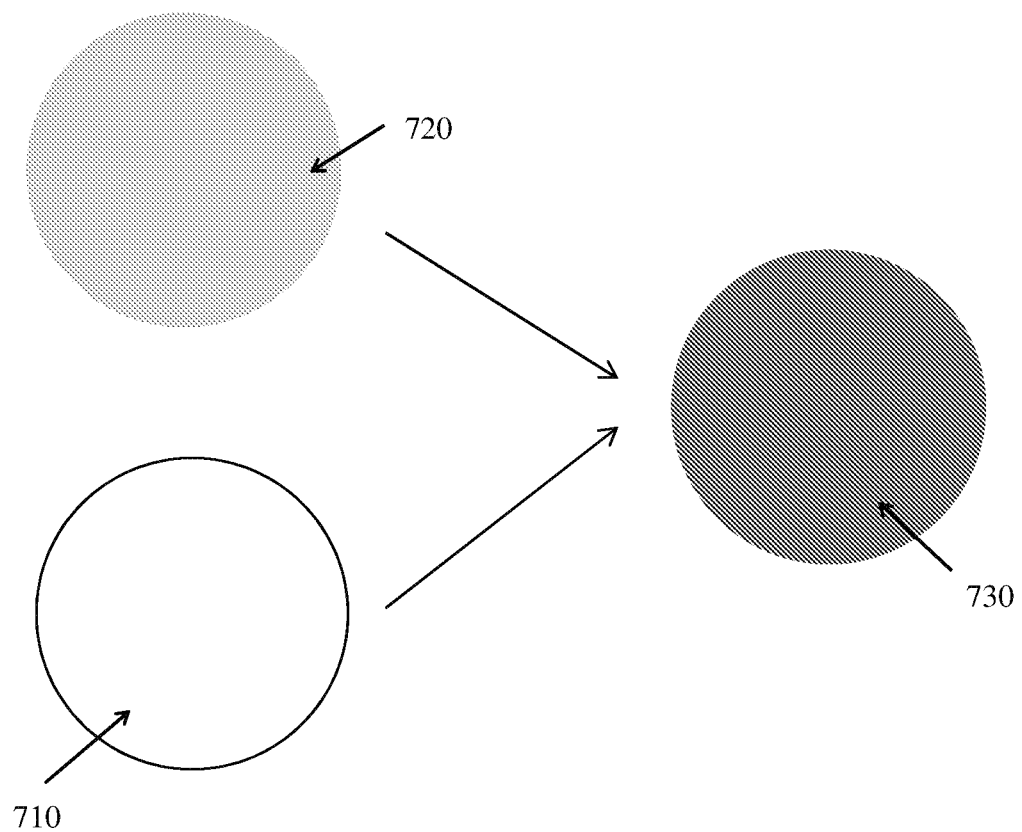
FIG. 7 is a schematic representation of an isolated region formed from a base layer and an image layer, according to one set of embodiments.
Figure 8:
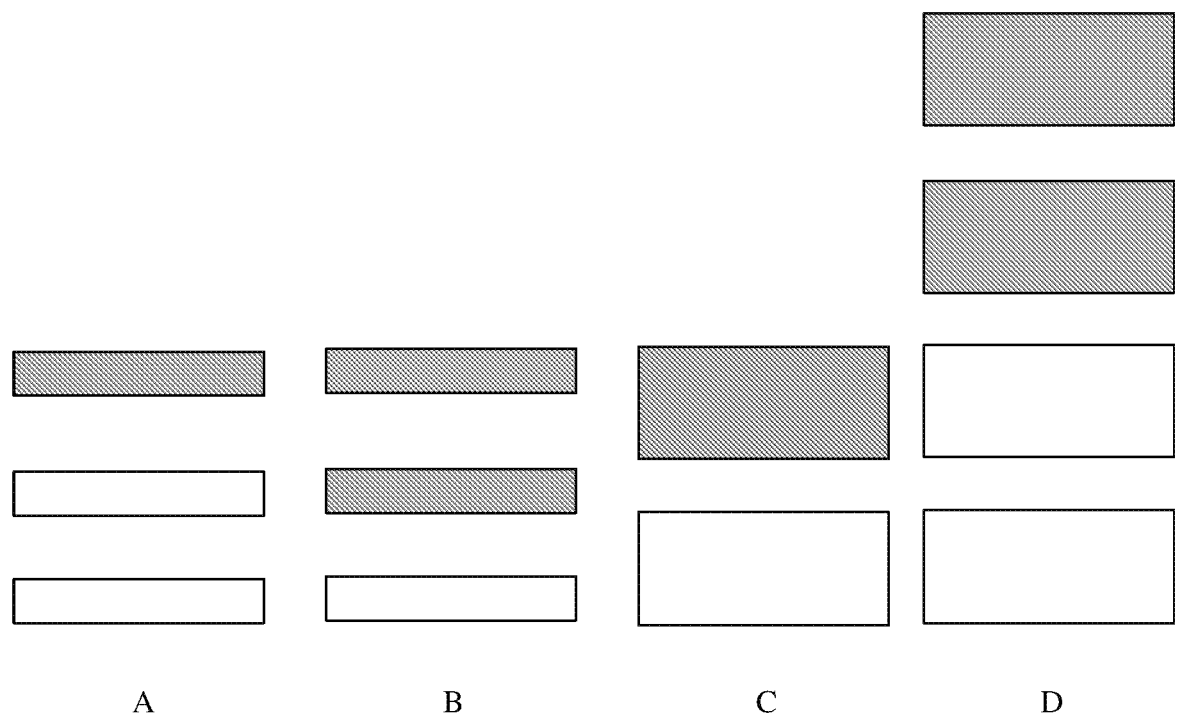
FIG. 8 are schematic cross-sectional views (A-D) of isolated regions in which the number and thicknesses of the base layers and/or image layers are chosen to provide enhanced vibrancy and/or opacity, according to some embodiments.

As described above, in some embodiments, at least a portion of the isolated regions comprise at least one base layer and/or at least one image layer disposed on the at least one base layer. The presence of at least one base layer may offer several advantages over the use of an image layer alone, including increasing the vibrancy and/or opacity of the image. That is to say, the presence of at least one base layer disposed under at least one image layer may increase the reflection of incident light (e.g., increasing the amount of light reflected per isolated region that, for example, reaches the eye of a viewer) or increase the absorption of incident light (e.g., decreasing the amount of light transmitted through the isolated region). For example, as illustrated in FIG. 7, image layer 720 is disposed upon base layer 710 (e.g., a white base layer) to form isolated region 730, resulting in a more vibrant color of isolated region 730 as compared to image layer 720 alone. As described above, for embodiments comprising substantially opaque isolated regions, and particularly for substantially completely opaque isolated regions, formed from one or more base layers and one or more image layers, it is the combination of the at least one base layer and the at least one image layer that generally results in providing the degree of opacity of the isolated region. It will be understood by those skilled in the art based upon the teachings of this specification that each of the one or more base layers and/or each of the one or more image layers in such a combination may or may not be substantially opaque individually, but may be substantially opaque only in combination/superposition (e.g., an image layer disposed on a base layer).

Thickness

Vibrancy may be further enhanced by, for example, using a combination of multiple layers of the one or more base layers, thicker layers of the one or more base layers, multiple layers of the one or more image layers, and/or thicker layers of the one or more image layers. FIG. 8A-D illustrates several cross-sectional views of exemplary arrangements and/or thicknesses of base layers (depicted white for illustrative purposes) and image layers (depicted grey for illustrative purposes) which can result in enhanced vibrancy and/or opacity as compared to the use of an image layer alone. The ratio of the average thickness of the one or more base layers (i.e. the total thickness of the one or more base layers) to the average thickness of the one or more image layers (i.e. the total thickness of the one or more image layers) may range between about 1:5 to about 5:1 (e.g., between about 1:2 and about 3:1). For example, in some embodiments, the ratio of the average thickness of the one or more base layers to the average thickness of the one or more image layers may be about 1:5, about 1:4, about 1:3, about 1:2, about 2:3, about 1:1, about 3:2, about 2:1, about 3:1, about 4:1, or about 5:1.

Opacity

Opacity of the graphic layer and/or of each isolated region may be measured by any suitable method known in the art including, for example, spectrophotometry (e.g., measured at a particular range of wavelengths of electromagnetic radiation, e.g. visible light—i.e. between about 380 nm and about 750 nm). Those skilled in the art would be capable of selecting appropriate methods for determining the opacity of the graphic layer and/or isolated regions. The average opacity of each substantially opaque isolated region may range, for example, between about 50% and about 100% (e.g., between about 80% and about 100%, between about 90% and about 95%, between about 90% and about 100%, between about 95% and about 100%, between about 99% and about 100%) depending on the desired visual representation/effect and the level of transparency of the surrounding transparent contiguous region(s). In certain embodiments, the average opacity of each substantially opaque isolated region may range, for example, between about 50% and about 100% of visible light (e.g., between about 80% and about 100% of visible light, between about 90% and about 95% of visible light, between about 90% and about 100% of visible light, between about 95% and about 100% of visible light, between about 99% and about 100% of visible light).

For embodiments in which the substantially opaque isolated regions are not substantially completely opaque (i.e. where the opacity of the isolated regions is less than approximately 100% average opacity), the overall transparency of a graphic layer containing the isolated regions will be a function not just of the percentage of surface area of the graphic layer occupied by the regions (as in the discussion above), but also of the average opacity of the isolated regions. In such situations, the overall graphic layer transparency may be determined by:

Graphic layer transparency=1−(individual isolated region average % opacity×% surface area coverage by isolated regions)

For example, if individual isolated regions are substantially completely opaque (i.e. are approximately 100% opaque) and they cover 20% of the total graphic layer, the graphic layer's transparency is 80%; whereas if the substantially opaque isolated regions are only 50% opaque but cover 40% of the total layer, the total layer's transparency is again 80%.

Dimensions

In some embodiments, the largest cross-sectional dimension of the base layer portion (e.g., comprising one or more base layers) of an isolated region may be greater than or less than the largest cross-sectional dimension of the superimposed image layer portion (e.g., comprising one or more image layers) of the isolated region. For example, in some embodiments, the ratio of the largest cross-sectional dimension of the base layer portion to the largest cross-sectional dimension of the image layer portion may be between about 0.9:1 to about 1.1:1. In some embodiments, the largest cross-sectional dimension of the base layer portion may be about equal to the largest cross-sectional dimension of the image layer portion (e.g., a ratio of about 1:1). The superposition of a base layer portion and an image layer portion having different cross-sectional dimensions may, in some cases, increase the vibrancy/recognizability of the image and/or alter the opacity of the graphic layer.

Those skilled in the art would understand that the largest cross-sectional dimension of an isolated region may be different than the largest cross-sectional dimension of the base layer portion and/or of the image layer portion of said isolated region. That is to say, for example, in cases where the largest-cross-sectional dimension of the base layer portion is greater than that of the image layer portion, the largest cross-sectional dimension of the isolated region comprising said base layer portion and image layer portion may be equal to the largest cross-sectional dimension of the base layer portion. However, in some cases (e.g., wherein the at least one base layer and the at least one image layer are not completely aligned/superimposed), the largest cross-sectional dimension of the isolated region may be determined by measuring the dimensions occupied by the combination of base layers and image layers.

Exemplary Materials for Forming Graphic Layers

The isolated regions may be formed of any suitable material for forming/displaying an image. Non-limiting examples of suitable materials include inks (including, for example, eco-solvent inks, solvent inks, latex inks, UV-cured inks), dyes, pigments (including, for example, organic pigments, complex inorganic ceramic pigments, mixed metal oxide pigments), paints (including, for example, paints employing acrylic resins such as polymethyl methacrylate, polyurethane resins, fluoropolymer resins such as polytetrafluoroethylene, polyvinyl fluoride, polyvinylidene fluoride, ethylene tetrafluoroethylene, or fluoroethylene vinyl ether, polyester resins, melamine resins, silane resins, epoxy resins, or other natural and/or synthetic resins), LEDs, electronic inks, or other such materials generally known to those skilled in the art. As described above, in some embodiments, the isolated regions are substantially opaque. The isolated regions may be deposited or formed on the contiguous layer using any suitable technique. Non-limiting examples of suitable techniques for depositing or forming the isolated regions include flatbed printing, inkjet printing, digital printing, lithographic printing, rotogravure printing, laser printing, screen printing, coil coating, etching of the contiguous layer material to alter its transparency, embedding, embossing, sand blasting, laser etching, laser marking, atomic layer deposition, chemical vapor deposition, or other methods known in the art.

In some embodiments, one or more base layers of an isolated region comprise inks (including, for example, eco-solvent inks, solvent inks, latex inks, UV-cured inks), pigments (including, for example, organic pigments, complex inorganic ceramic pigments, mixed metal oxide pigments), dyes, paints (including, for example, paints employing acrylic resins such as polymethyl methacrylate, polyurethane resins, fluoropolymer resins such as polytetrafluoroethylene, polyvinyl fluoride, polyvinylidene fluoride, ethylene tetrafluoroethylene, or fluoroethylene vinyl ether, polyester resins, melamine resins, silane resins, epoxy resins, or other natural and/or synthetic resins), LEDs, electronic inks, or other such materials generally known to those skilled in the art. The ink, pigment, dye, paint, LEDs, electronic inks, and/or other such materials may comprise a weather-resistant (e.g., outdoor-rated) material and/or be UV-cured. Each base layer may be a single color (e.g., white) or a plurality of colors and may be the same or different. In some embodiments, the base layer itself is substantially opaque or substantially completely opaque. As described above, the base layer (e.g., a white base layer) may increase the opacity and/or vibrancy of the image.

In certain embodiments, the image layer comprises inks (including, for example, eco-solvent inks, solvent inks, latex inks, UV-cured inks), dyes, pigments (including, for example, organic pigments, complex inorganic ceramic pigments, mixed metal oxide pigments), paints (including, for example, paints employing acrylic resins such as polymethyl methacrylate, polyurethane resins, fluoropolymer resins such as polytetrafluoroethylene, polyvinyl fluoride, polyvinylidene fluoride, ethylene tetrafluoroethylene, or fluoroethylene vinyl ether, polyester resins, melamine resins, silane resins, epoxy resins, or other natural and/or synthetic resins), LEDs, electronic inks, or other such materials generally known to those skilled in the art. The inks, dyes, pigments, paints, LEDs, electronic inks or other such materials may comprise a weather resistant (e.g., outdoor-rated) material and/or be UV-cured. The image layer in one exemplary isolated region may comprise a single color and may be the same or different color than an image layer in a different isolated region. In some such embodiments, the plurality of isolated regions together may form a recognizable image, as described above.

In some embodiments, an image layer in one exemplary isolated region may comprise two or more colors, three or more colors, four or more colors, or a plurality of colors. For example, the image layer of an isolated region may comprise a combination of CMYK inks, RGB inks, Pantone colors, or other color combinations known in the art.

While the description above primarily relates to isolated regions comprising one or more base layers and one or more image layers, it will be understood by those skilled in the art that there not necessarily be a separate base layer and that the isolated region may be fabricated in such a manner to impart the particular properties (e.g., opacity, thickness, dimensions, shape) described above, without the base layer. That is to say, in some embodiments, the plurality of isolated regions (e.g., substantially opaque isolated regions) may comprise one or more image layers.

Contiguous Layer Forming Materials

Transparency

The contiguous layer in preferred embodiments comprises a material at least some portion of which is substantially transparent to at least one wavelength within the electromagnetic radiation spectrum. The contiguous layer may be partially transparent. That is to say, the contiguous layer, or only a portion of the contiguous layer, may permit only certain ranges of wavelengths of electromagnetic radiation (e.g., infrared light, visible light, ultraviolet light) to pass through the material. In some embodiments, the contiguous layer is substantially transparent to a broad range of wavelengths of electromagnetic radiation. For example, in some embodiments, the contiguous layer will be substantially transparent with respect to some wavelengths falling within a range of electromagnetic radiation, e.g. wavelengths in at least some portion(s) of the visible light spectrum. In specific embodiments, the range in which the contiguous layer will be substantially transparent will include all or some portion of, and in certain embodiments substantially all of, the range between an average wavelength between about 10 nm and about 1,000,000 nm; in certain embodiments between about 300 nm and about 1200 nm, in certain embodiments between about 380 nm and about 750 nm, and in certain embodiments between about 600 nm and about 1200 nm. The average wavelength refers to the wavelength at which the average peak maximum of the electromagnetic radiation occurs in the spectrum of light transmitted through the transparent material. The average wavelength may be a particular peak maximum having the largest intensity in a particular spectrum of electromagnetic radiation (e.g., visible light), or, alternatively, the average wavelength may be a peak in an electromagnetic spectrum that has at least a defined maximum, but a smaller intensity relative to other peaks in the spectrum. For example, in some embodiments, the contiguous layer will be substantially transparent with respect to electromagnetic radiation having an average wavelength greater than or equal to about 10 nm, greater than or equal to about 300 nm, greater than or equal to about 380 nm, greater than or equal to about 500 nm, greater than or equal to about 600 nm, greater than or equal to about 700 nm, greater than or equal to about 750 nm, greater than or equal to about 800 nm, greater than or equal to about 900 nm, or greater than or equal to about 1200 nm. In certain embodiments, the contiguous layer will be substantially transparent with respect to electromagnetic radiation having an average wavelength less than about 1,000,000 nm, less than about 1200 nm, less than about 900 nm, less than about 800 nm, less than about 700 nm, less than about 600 nm, less than about 500 nm, less than about 380 nm, or less than about 300 nm. Combinations of the above-referenced ranges are also possible (e.g., an average wavelength between about 300 nm and about 1200 nm, between about 380 nm and about 750 nm, between about 600 nm and about 1200 nm). Other ranges are also possible.

Materials

The transparent material may comprise any suitable material capable of transmitting electromagnetic radiation to the desired extent. Non-limiting examples of suitable transparent materials include glass (including, for example, low-iron glass with or without anti-reflective and/or anti-glare coating), clear coats, transparent plasticizers, and polymers such as polyacrylics, polyvinyls (e.g., transparent vinyl materials such as, for example, those used in window decal and vehicle decal or wrap applications), fluoropolymers (e.g., polytetrafluoroethylene, polyvinyl fluoride, polyvinylidene fluoride, ethylene tetrafluoroethylene, fluorinated ethylene propylene, fluoroethylene vinyl ether), urethanes, polyurethanes, polycarbonates, polyesters, and other transparent polymers.

PV Modules

As described above, the graphic layers described above may have particular utility to enhance the aesthetic appearance of solar panels (i.e. photovoltaic modules) in certain preferred embodiments. Accordingly, certain embodiments involve the provision or formation of a photovoltaic module comprising one or more graphic layers as described herein. The one or more graphic layers may be arranged in any suitable arrangement. For example, in some embodiments, the one or more graphic layers are disposed on or otherwise positioned in proximity to a photovoltaic layer in a manner that the one or more graphic layers forms an image or pattern to a viewer observing the photovoltaic layer. In certain embodiments, the one or more graphic layers may be positioned in front of the photovoltaic layer (i.e. between the active (light-incident), visible surface of the photovoltaic layer and a viewer; e.g., the one or more graphic layers may be disposed on or under one or more layers (e.g., a protective layer, an encapsulant layer) adjacent to or disposed on the active surface (i.e. light incident surface, as defined above) of the photovoltaic layer). That is to say, in some embodiments, one or more additional layers may be disposed between the one or more graphic layers and the photovoltaic layer and/or between the one or more graphic layers and the viewer while maintaining the graphic layers in front of the photovoltaic layer. The phrase light-incident surface of a photovoltaic layer/cell generally refers to the top protective cover of a solar photovoltaic device (such as glass, acrylic, front sheet utilizing fluoropolymers such as polytetrafluoroethylene, polyvinyl fluoride, polyvinylidene fluoride, ethylene tetrafluoroethylene, fluorinated ethylene propylene, or fluoroethylene vinyl ether, silicone encapsulant, or any other transparent cover material utilized in the manufacture of photovoltaic modules and known in the art) and/or the surface of a photovoltaic device that is configured and positioned to receive incident electromagnetic radiation for the generation of electricity (e.g., the active surface of a photovoltaic layer positioned, for example, such that the electromagnetic radiation interacts with the photovoltaic layer such that electric current is generated). Electromagnetic radiation (e.g., typical wavelengths of "light" as used herein) is described in more detail, below.

Figure 9:
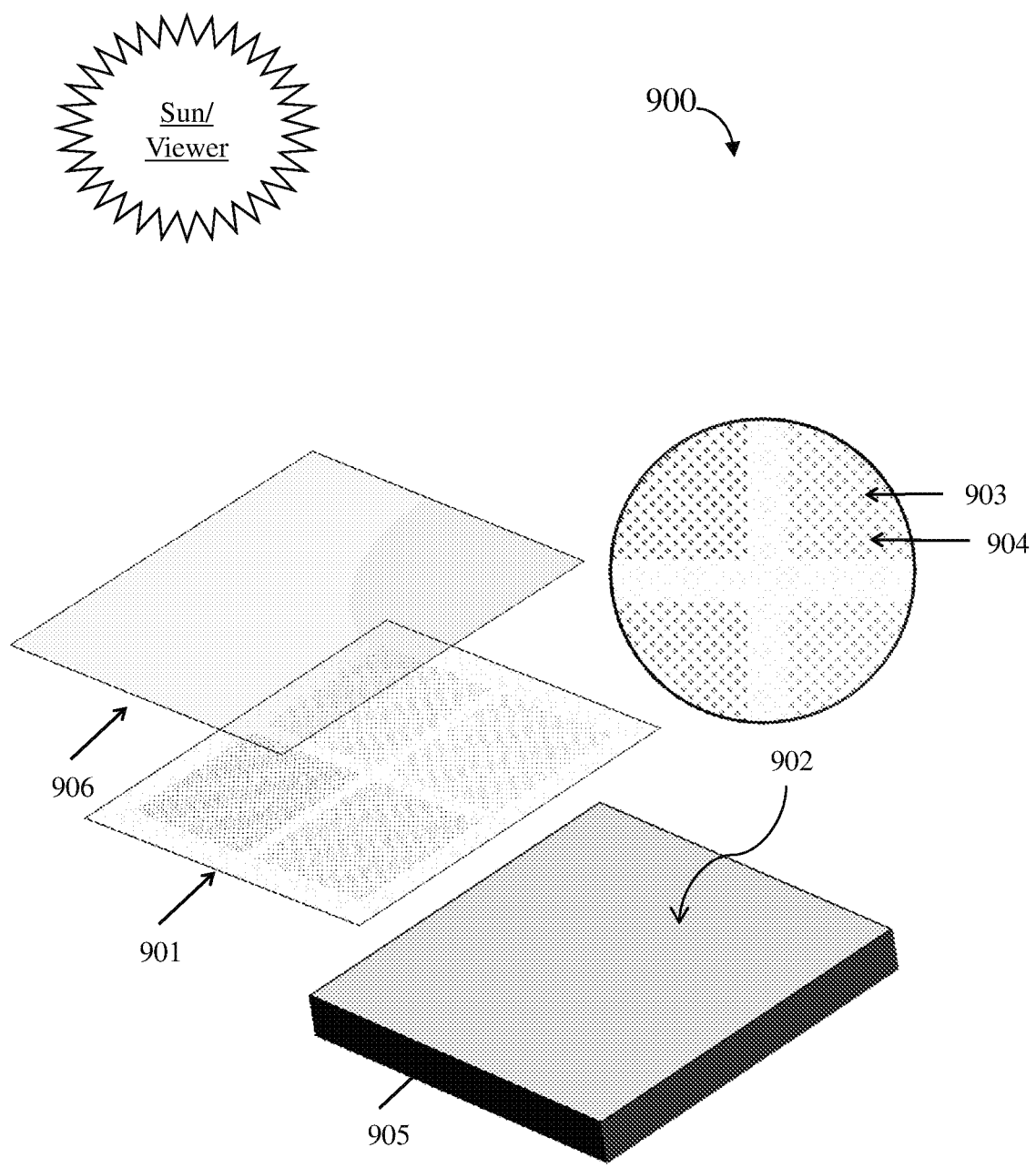
FIGS. 9-12 are exploded isometric schematic views of embodiments of photovoltaic modules comprising a graphic layer, according to some embodiments.

For example, FIG. 9 is an exploded isometric schematic of an exemplary arrangement of a photovoltaic module 900 comprising a graphic layer 901. In some embodiments, graphic layer 901 (comprising a plurality of isolated regions 903, each comprising one or more base layers and/or one or more image layers, and a contiguous region 904) is adhered to a light-incident surface 902 of a photovoltaic layer 905. Photovoltaic layer generally refers to a layer of a photovoltaic module which absorbs electromagnetic radiation such that current is generated, as is described in more detail below. In some such embodiments, graphic layer 901 is positioned in front of and optionally superimposed on at least a portion of the light-incident surface 902 of solar photovoltaic layer 905 such that the transparent contiguous regions 904 may permit incident light to be transmitted through, enabling the photovoltaic layer 905 to convert said incident light into energy. Isolated regions 903 may absorb certain ranges of wavelengths of electromagnetic radiation, transmit certain other ranges of wavelengths of electromagnetic radiation through, and reflect certain other ranges of wavelengths. The plurality of isolated regions 903 may together form an image and/or pattern which may be made visible to a viewer by the light that is reflected by the isolated regions 903. That is to say, graphic layer 901 comprises an image and/or pattern that is generally reflected back to the eyes of a viewer, such that the visual appearance of the photovoltaic layer 905 is that of the image and/or pattern.

In certain embodiments, graphic layer 901 may be adhered to the light-incident surface 902 (or alternatively to intervening layers adjacent to photovoltaic layer 905 not shown) using a variety of techniques. For example, the graphic layer may be adhered using semi-permanent adhesive (e.g., such as those used to adhere vinyl materials onto outdoor surfaces) and/or adhesive which may be removable so as to replace the graphic layer 901. In some embodiments, the graphic layer is adhered using a permanent adhesive including, but not limited to, encapsulants such as polyvinyl butyral, silicone, polydimethylsiloxane, ionomer, ethylene vinyl acetate, polyolefin, or thermoplastic polyurethane, temperature-cured adhesives, pressure-sensitive adhesives, or UV-cured adhesives, or by mechanical means such as clamping down with frames, or by employing other materials or methods known to those skilled in the art. In some embodiments, the graphic layer adheres to the light-incident surface (or alternatively to the intervening layers adjacent the photovoltaic layer) via formation of a bond, such as an ionic bond, a covalent bond, a hydrogen bond, Van der Waals interactions, and the like. The covalent bond may be, for example, carbon-carbon, carbon-oxygen, oxygen-silicon, sulfur-sulfur, phosphorus-nitrogen, carbon-nitrogen, metal-oxygen, or other covalent bonds. The hydrogen bond may be, for example, between hydroxyl, amine, carboxyl, thiol, and/or similar functional groups.

In some embodiments, the photovoltaic module comprising the graphic layer further comprises an optional transparent protective cover. Referring again to FIG. 9, in some embodiments, photovoltaic module 900 comprises optional transparent protective cover 906. The transparent protective cover 906 may comprise any suitable material capable of transmitting electromagnetic radiation to the desired extent. Non-limiting examples of suitable transparent materials include glass (including, for example, low-iron glass with or without anti-reflective and/or anti-glare coating), clear coats, transparent plasticizers, and polymers such as polyacrylics, polyvinyls (e.g., transparent vinyl materials such as, for example, those used in window decal and vehicle decal or wrap applications), fluoropolymers (e.g., polytetrafluoroethylene, polyvinyl fluoride, polyvinylidene fluoride, ethylene tetrafluoroethylene, fluorinated ethylene propylene, fluoroethylene vinyl ether), polycarbonates, polyesters, and other transparent polymers. Such protective covers may help to protect the photovoltaic module and/or the graphic layer from weather damage and/or increase the lifetime of the photovoltaic module. The protective cover 906 may be adhered to the photovoltaic module 900 or the graphic layer 901 using any of a variety of semi-permanent adhesives (e.g., such as those used to adhere vinyl materials onto outdoor surfaces) or permanent adhesives (e.g., encapsulants such as polyvinyl butyral, silicone, polydimethylsiloxane, ionomer, ethylene vinyl acetate, polyolefin, or thermoplastic polyurethane, temperature-cured adhesives, pressure-sensitive adhesives, or UV-cured adhesives), or by mechanical means such as clamping down with frames, or by employing other materials or methods known to those skilled in the art.

Figure 10:
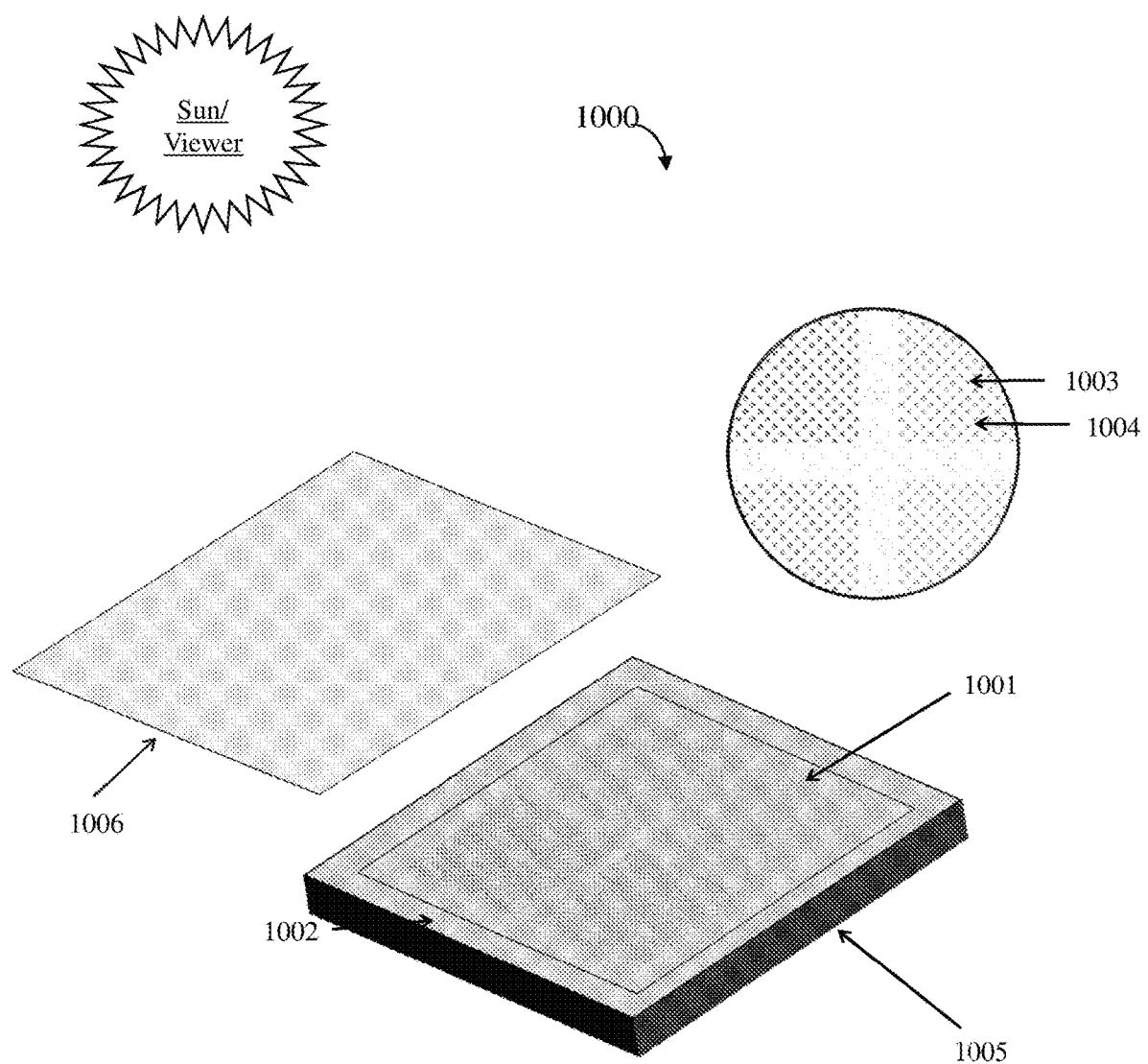

FIG. 10 is an exploded isometric schematic of another exemplary arrangement of a photovoltaic module 1000 comprising a graphic layer 1001. In some such embodiments (as illustrated), the graphic layer may be deposited directly onto a light-incident surface of the photovoltaic layer. Non-limiting examples of suitable techniques for depositing the graphic layer include flatbed printing, inkjet printing, digital printing, lithographic printing, rotogravure printing, laser printing, screen printing, coil coating, etching, embedding, embossing, sand blasting, laser etching, laser marking, atomic layer deposition, chemical vapor deposition, or other methods known in the art. For example, photovoltaic layer 1005 may comprise light-incident surface 1002, graphic layer 1001 disposed on surface 1002, and optional protective cover 1006 (e.g., disposed on graphic layer 1001). In some such embodiments, graphic layer 1001 comprises a plurality of isolated regions 1003 (e.g., comprising one or more base layers and/or one or more image layers) and transparent contiguous region 1004. Contiguous region 1004 may be the light-incident surface 1002 of photovoltaic layer 1005 (e.g., which may comprise glass, acrylic, front sheet utilizing fluoropolymers such as polytetrafluoroethylene, polyvinyl fluoride, polyvinylidene fluoride, ethylene tetrafluoroethylene, fluorinated ethylene propylene, or fluoroethylene vinyl ether, silicone encapsulant, or any other transparent cover material utilized in the manufacture of photovoltaic modules and known in the art). That is to say, contiguous region 1004 need not be a physically separate material from that used to form the light-incident surface 1002.

The transparent contiguous region 1004 may permit incident light to be transmitted through, enabling the photovoltaic layer 1005 to convert said incident light into energy. Isolated regions 1003 may absorb certain ranges of wavelengths of electromagnetic radiation, transmit certain other ranges of wavelengths of electromagnetic radiation through, and reflect certain other ranges of wavelengths. The plurality of isolated regions 1003 may together form an image and/or pattern which may be made visible to a viewer by the light that is reflected by the isolated regions 1003. That is to say, graphic layer 1001 comprises an image and/or pattern that is generally reflected back to the eyes of a viewer, such that the visual appearance of the photovoltaic layer 1005 is that of the image and/or pattern.

In some embodiments, the photovoltaic module comprising the graphic layer further comprises an optional transparent protective cover. Referring again to FIG. 10, in some embodiments, photovoltaic module 1000 comprises optional transparent protective cover 1006. The transparent protective cover 1006 may comprise any suitable material capable of transmitting electromagnetic radiation to the desired extent. Non-limiting examples of suitable transparent materials include glass (including, for example, low-iron glass with or without anti-reflective and/or anti-glare coating), transparent plasticizers, clear coats, and polymers such as polyacrylics, polyvinyls (e.g., transparent vinyl materials such as, for example, those used in window decal and vehicle decal or wrap applications), fluoropolymers (e.g., polytetrafluoroethylene, polyvinyl fluoride, polyvinylidene fluoride, ethylene tetrafluoroethylene, fluorinated ethylene propylene, fluoroethylene vinyl ether), polycarbonates, polyesters, and other transparent polymers. Such protective covers may help to protect the photovoltaic module and/or the graphic layer from weather damage and/or increase the lifetime of the photovoltaic module. The protective cover 1006 may be adhered to the photovoltaic module 1000 or the graphic layer 1001 using any of a variety of semi-permanent adhesives (e.g., such as those used to adhere vinyl materials onto outdoor surfaces) or permanent adhesives (e.g., encapsulants such as polyvinyl butyral, silicone, polydimethylsiloxane, ionomer, ethylene vinyl acetate, polyolefin, or thermoplastic polyurethane, temperature-cured adhesives, pressure-sensitive adhesives, or UV-cured adhesives), or by mechanical means such as clamping down with frames, or by employing other materials or methods known to those skilled in the art.

Figure 11:
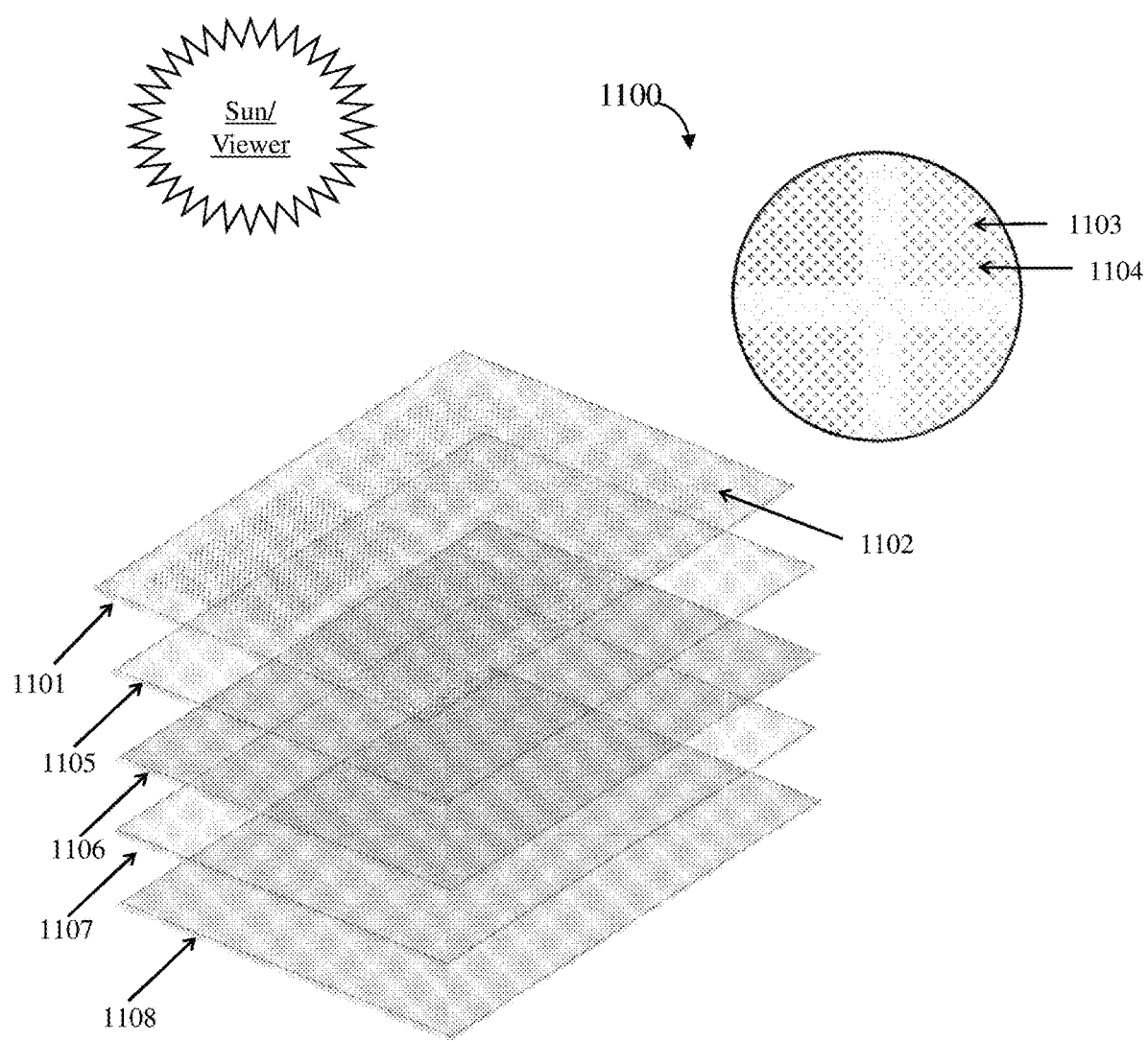

FIG. 11 is an exploded isometric schematic of another exemplary arrangement of a photovoltaic module 1100 comprising a graphic layer 1102. In this view, the solar photovoltaic module 1100 is shown, including a light-incident surface 1101, the graphic layer 1102, encapsulant layers 1105 and 1107, photovoltaic layer 1106, and protective back cover 1108. In some such embodiments (as illustrated), the graphic layer 1102 may be deposited directly onto the underside of the light-incident surface 1101 of the photovoltaic module. Non-limiting examples of suitable techniques for depositing the graphic layer include flatbed printing, inkjet printing, digital printing, rotogravure printing lithographic printing, laser printing, screen printing, coil coating, etching, embedding, embossing, sand blasting, laser etching, laser marking, atomic layer deposition, chemical vapor deposition, or other methods known in the art. The encapsulant layers 1105 and 1107 may comprise the same or different materials and may comprise, for example, an adhesive or encapsulant such as ethylene vinyl acetate, silicone, or other materials utilized in the manufacture of photovoltaic modules and known in the art. Photovoltaic layer 1106 is made of electrically connected crystalline silicon cells although in other embodiments it may be made of other photovoltaically active materials utilized in the manufacture of photovoltaic modules and known in the art. Protective back cover 1108 may comprise a polymer such as polyvinyl fluoride (e.g., TEDLAR®, Dunmore's Dun-Solar TPE) or the like. Protective back covers are known in the art and those skilled in the art would be capable of selecting appropriate materials.

In some embodiments, graphic layer 1102 comprises a plurality of isolated regions 1103 (e.g., comprising one or more base layers and/or one or more image layers) and transparent contiguous region 1104. Contiguous region 1104 may be the light-incident surface 1101 of photovoltaic module 1100 (e.g., which may comprise glass, acrylic, front sheet utilizing fluoropolymers such as polytetrafluoroethylene, polyvinyl fluoride, polyvinylidene fluoride, ethylene tetrafluoroethylene, fluorinated ethylene propylene, or fluoroethylene vinyl ether, silicone encapsulant or any other transparent cover material utilized in the manufacture of photovoltaic modules and known in the art). That is to say, contiguous region 1104 need not be a physically separate material from that used to form the light-incident surface 1101.

The transparent contiguous region 1104 may permit incident light to be transmitted through, enabling the photovoltaic layer 1106 to convert said incident light into energy. Isolated regions 1103 may absorb certain ranges of wavelengths of electromagnetic radiation, transmit certain other ranges of wavelengths of electromagnetic radiation through, and reflect certain other ranges of wavelengths. The plurality of isolated regions 1103 may together form an image and/or pattern which may be made visible to a viewer by the light that is reflected by the isolated regions 1103. That is to say, graphic layer 1102 comprises an image and/or pattern that is generally reflected back to the eyes of a viewer, such that the visual appearance of the photovoltaic module 1100 is that of the image and/or pattern.

The entire stack of components depicted in FIG. 11 may be laminated following established practices for laminating a solar module which are known to practitioners of the art.

Figure 12:
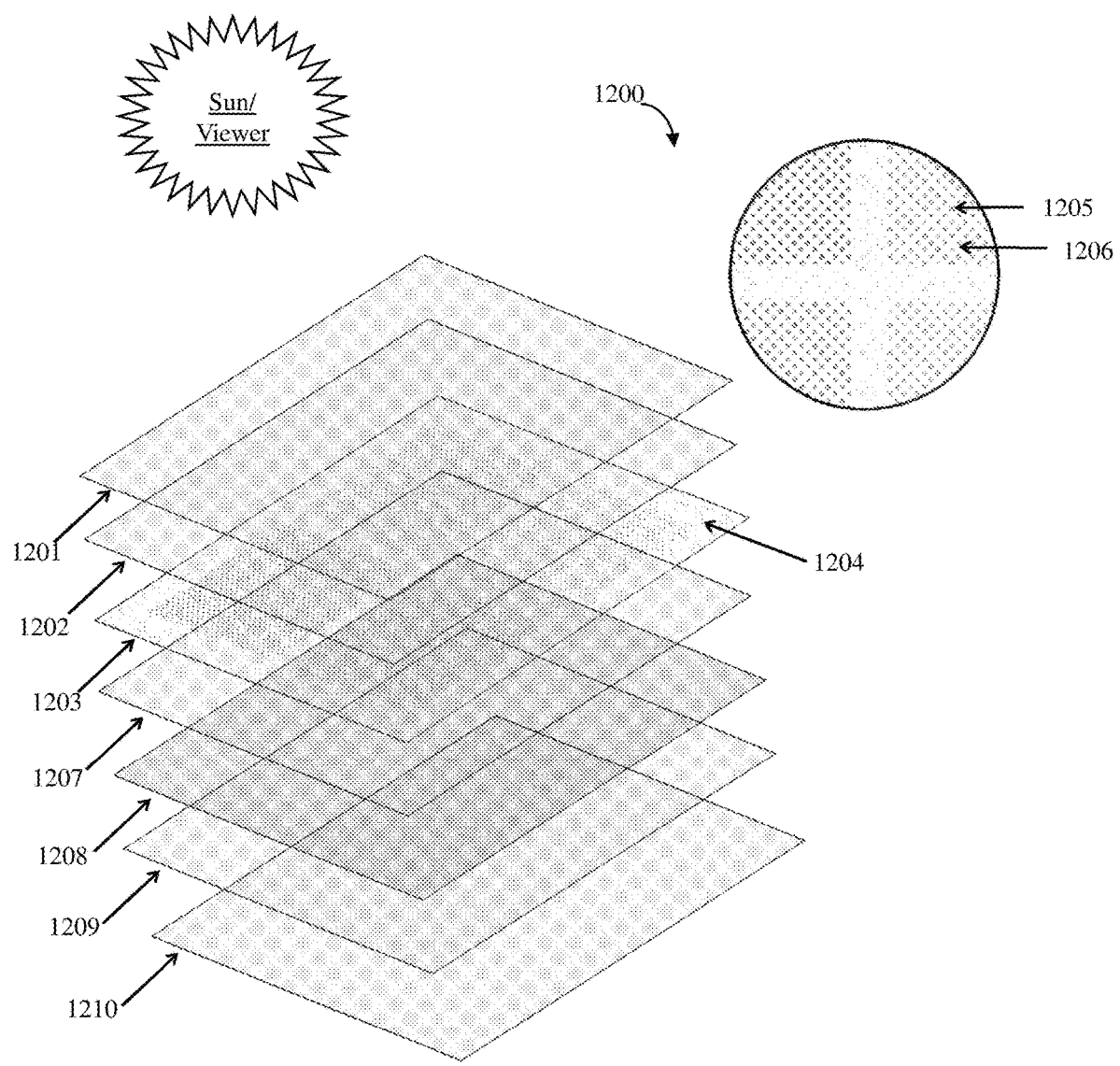

FIG. 12 is an exploded isometric schematic of another exemplary arrangement of a photovoltaic module 1200 comprising a graphic layer 1203. In this view, the solar photovoltaic module 1200 is shown, including a light-incident surface 1201, encapsulant layers 1202, 1207, and 1209, graphic layer 1203 containing image and/or pattern 1204, photovoltaic layer 1208, and protective back cover 1210. The light-incident surface 1201 may comprise glass, acrylic, front sheet utilizing fluoropolymers such as polytetrafluoroethylene, polyvinyl fluoride, polyvinylidene fluoride, ethylene tetrafluoroethylene, fluorinated ethylene propylene, or fluoroethylene vinyl ether, silicone encapsulant or any other transparent cover material utilized in the manufacture of photovoltaic modules and known in the art. The encapsulant layers 1202, 1207 and 1209 may comprise the same or different materials and may comprise, for example, an adhesive or encapsulant such as ethylene vinyl acetate, silicone, or other materials utilized in the manufacture of photovoltaic modules and known in the art. Photovoltaic layer 1208 is made of electrically connected crystalline silicon cells although in other embodiments it may be made of other photovoltaically active materials utilized in the manufacture of photovoltaic modules and known in the art. Protective back cover 1210 may comprise a polymer such as polyvinyl fluoride (e.g., TEDLAR®, Dunmore's Dun-Solar TPE) or the like. Protective back covers are known in the art and those skilled in the art would be capable of selecting appropriate materials.

In some embodiments, graphic layer 1203 comprises a plurality of isolated regions 1205 (e.g., comprising one or more base layers and/or one or more image layers) and transparent contiguous region 1206. The transparent contiguous region 1206 may permit incident light to be transmitted through, enabling the photovoltaic layer 1208 to convert said incident light into energy. Isolated regions 1205 may absorb certain ranges of wavelengths of electromagnetic radiation, transmit certain other ranges of wavelengths of electromagnetic radiation through, and reflect certain other ranges of wavelengths. The plurality of isolated regions 1205 may together form an image and/or pattern 1204 which may be made visible to a viewer by the light that is reflected by the isolated regions 1205. That is to say, graphic layer 1203 comprises an image and/or pattern 1204 that is generally reflected back to the eyes of a viewer, such that the visual appearance of the photovoltaic module 1200 is that of the image and/or pattern 1204.

The entire stack of components depicted in FIG. 12 may be laminated following established practices for laminating a solar module which are well-known to practitioners of the art.

Photovoltaic layers are generally known in the art and may, for example, comprise materials such as crystalline silicon, amorphous silicon, cadmium telluride, copper indium gallium selenide, organic photovoltaic materials, or other photovoltaic materials known to those skilled in the art. Other photovoltaic layers are also possible. In some cases, the photovoltaic modules may be rigid or flexible.

EXAMPLES

Example 1

The following example describes the design and selection of functional parameters for creation of a graphic layer, according to some embodiments.

A step for preparing a graphic layer of the invention involved modifying an image to achieve a certain transparency and a certain resolution by the calculation of the isolated region size and the number of isolated regions per unit area. The following description is an exemplary method for calculating these parameters using a formulaic approach. For substantially circular isolated region shapes, let the isolated region radius be represented by r, and the number of isolated regions per unit area by n. Let A represent the total surface area of the image. Let T represent the desired transparency, measured as the percentage of an image's surface area that is transparent. Let D represent the desired image resolution, measured in isolated regions (in this case Dots) Per Inch or DPI. Then, the two unknowns, n and r, may be given by:

$$n = D^2 * A$$

$$r = \sqrt{\{[(1-T)*A]/[n*\pi]\}}$$

A "clipping mask" that can be used to digitally clip out just the necessary portions from an image was then created in a graphical algorithm editor (e.g., Grasshopper®). FIG. 3B depicts an illustrative clipping mask of length, L, and breadth, B, containing a plurality of circles 320. Essentially a grid made of objects (in this exemplary case, the objects being circles), the mask can be overlaid on an image and an image editing software (e.g., Adobe Illustrator®) can be used to parse out just those portions of the image that are superimposed by the objects. In this example, the clipping mask was arranged such that the circles in adjacent columns, and the circles in adjacent rows, are offset. As illustrated in FIG. 3B, odd numbered columns $C_1$, $C_3$, $C_5$ . . . are offset from even numbered columns $C_2$, $C_4$, $C_6$ . . . . Similarly, adjacent rows of circles are offset as well. Thus, odd numbered rows $R_1$, $R_3$, $R_5$ . . . are offset from even numbered rows $R_2$, $R_4$, $R_6$ . . . . This offsetting of circles, which will eventually turn into offsetting of opaque isolated regions in the modified final image, may permit a more cohesive appearance of the image to the human eye. Without the offsetting, the visual appearance of the image may deteriorate. Finally, it may be observed that the number of even numbered columns is one fewer than the number of odd numbered columns and the number of even numbered rows is one fewer than the number of odd numbered rows. Thus, if the total number of columns is x, the number of odd numbered columns will be (x+1)/2 and the number of even numbered columns will be (x−1)/2; and if the total number of rows is y, the number of odd numbered rows will be (y+1)/2 and the number of even numbered rows will be (y−1)/2.

To determine the exact number of circles in each row and column, and to determine the spacing between the circles, a formulaic approach may be employed. Referring again to FIG. 3B, the total number of circles (which must equal the n calculated previously) is given by the equation:

$$((x+1)/2 * (y+1)/2) + ((x-1)/2 * (y-1)/2) = n$$

FIG. 5 is a close-up view of a set of four adjacent circles in the clipping mask. In this illustrative case, the degree of offset between two adjacent columns, as well as between two adjacent rows, is about 45 degrees. As a result, it may be seen that when the centers of the four circles are connected, it forms an imaginary square. Let U be the distance between the edge of two circles along the line that connects the centers of the two circles; therefore it follows that U+2r is the total length of the imaginary square's edge. It therefore further follows that the total area occupied by the four quarter circles within the imaginary square, when expressed as a percentage of the area of the imaginary square, equals the desired degree of opacity, i.e. (1−T), such that:

$$U^2+4rU+(4-\pi/(1-T))r^2=0$$

Using the solution for quadratic equation, one may deduce the set of two possible values for U. One of those values will be negative, which must be discarded, leaving the positive value as the only realistic possibility.

FIG. 4 illustrates the orientation of three neighboring isolated regions. It depicts as S the distance between the centers of two circles that are on the same row. Since, the angle of offset, (θ, theta) in this illustrative case is 45 degrees, and the circles in adjacent columns are equally spaced apart (in this illustrative case), it follows therefore that $$S=2*\cos 45*(U+2r)$$

Finally, x and y are given by $$x=2L/S$$

$$y=2B/S$$

It therefore follows that the clipping mask can be created comprising n circles, each of radius r, which are arranged in a pattern of x columns and y rows such that neighboring columns and neighboring rows are offset by a chosen angle (in this illustrative case, 45 degrees) and the neighboring circles in a row, as well as neighboring circles in a column, are spaced apart S, center to center.

Figure 6A:
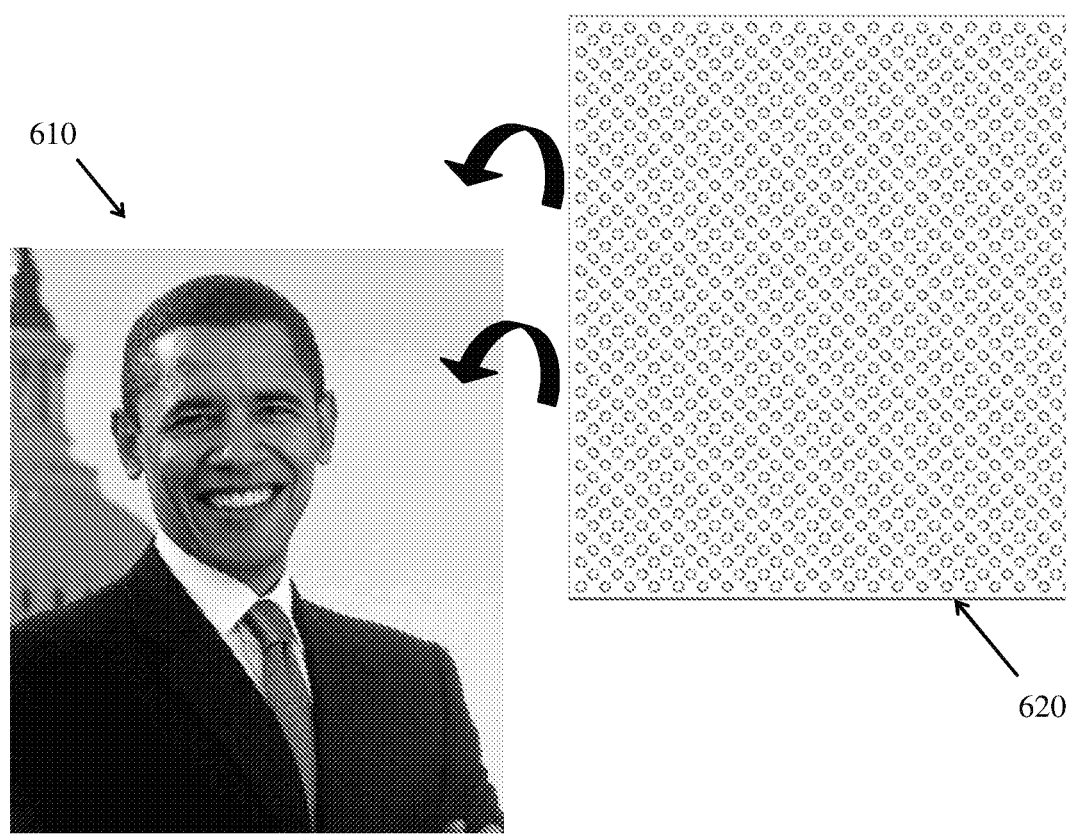
FIG. 6A is a schematic representation of a clipping mask being superimposed on an image, according to some embodiments.
Figure 6B:
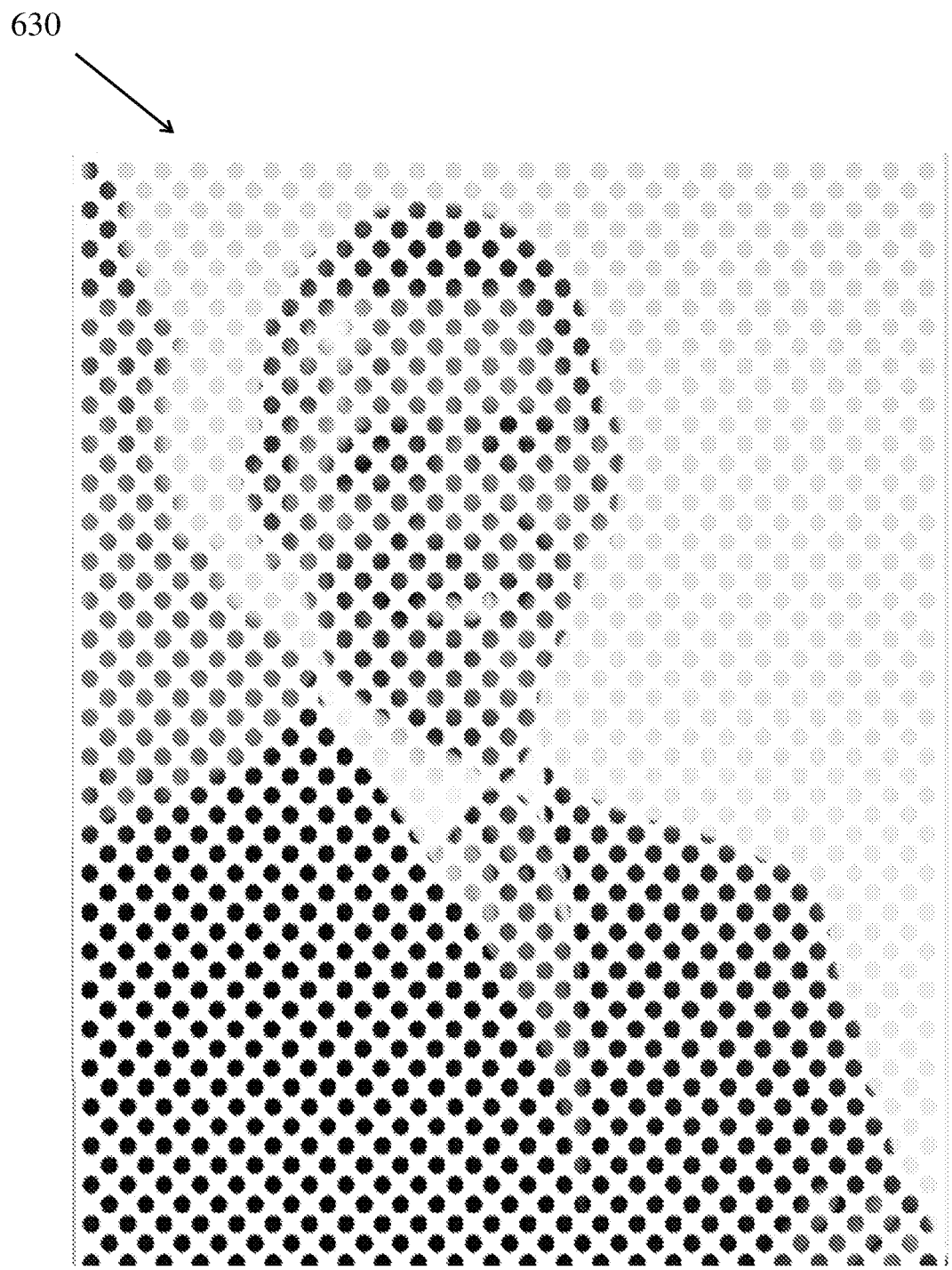
FIG. 6B is a schematic representation of an image modified after superimposition of a clipping mask on the image, according to some embodiments.

Once the clipping mask was thus created, it was overlaid onto the original image in a digital image editing software (e.g., Adobe Illustrator®) and the image was digitally "clipped" such that only those sections of the image that were superimposed by the circles in the clipping mask were retained, with the remainder of the spaces rendered transparent. That is to say, the clipping mask is generally a pre-determined pattern which is used to define the modified image. FIG. 6A-B illustrates clipping mask 620 superimposed on original image 610 and the clipping function carried out in the software, resulting in the modified image 630 where only those sections of the image that were underneath the circles in the clipping mask were retained, with the rest of the spaces being empty, or transparent. In some types of software, the sections of the image that are clipped and preserved may retain a non-zero vector value equal to the CMYK color codes of those sections, and the remainder of the image may be rendered a zero vector value, indicating complete transparency in the software. Factors such as brightness, contrast, hue, color temperature, CMYK color values, etc. may also be adjusted to enhance the vibrancy of the modified image.

Example 2

Figure 13A:
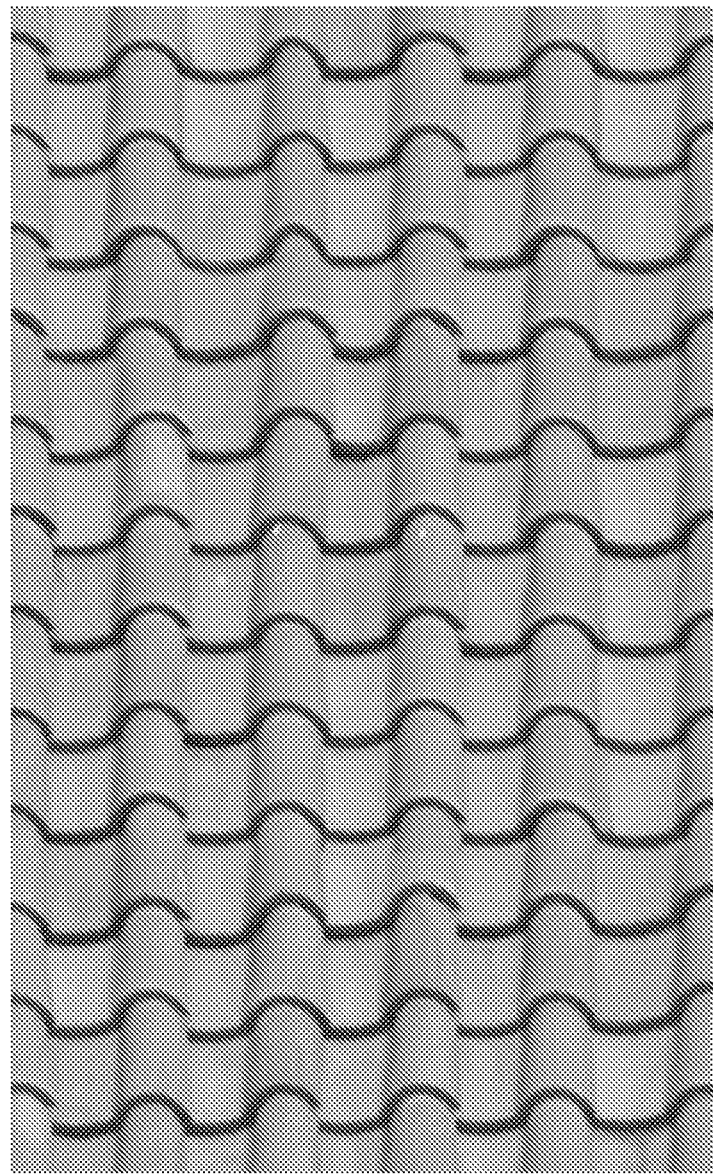
FIG. 13A shows an exemplary image of rooftop tiles to be integrated into a solar panel, according to one set of embodiments.
Figure 13B:
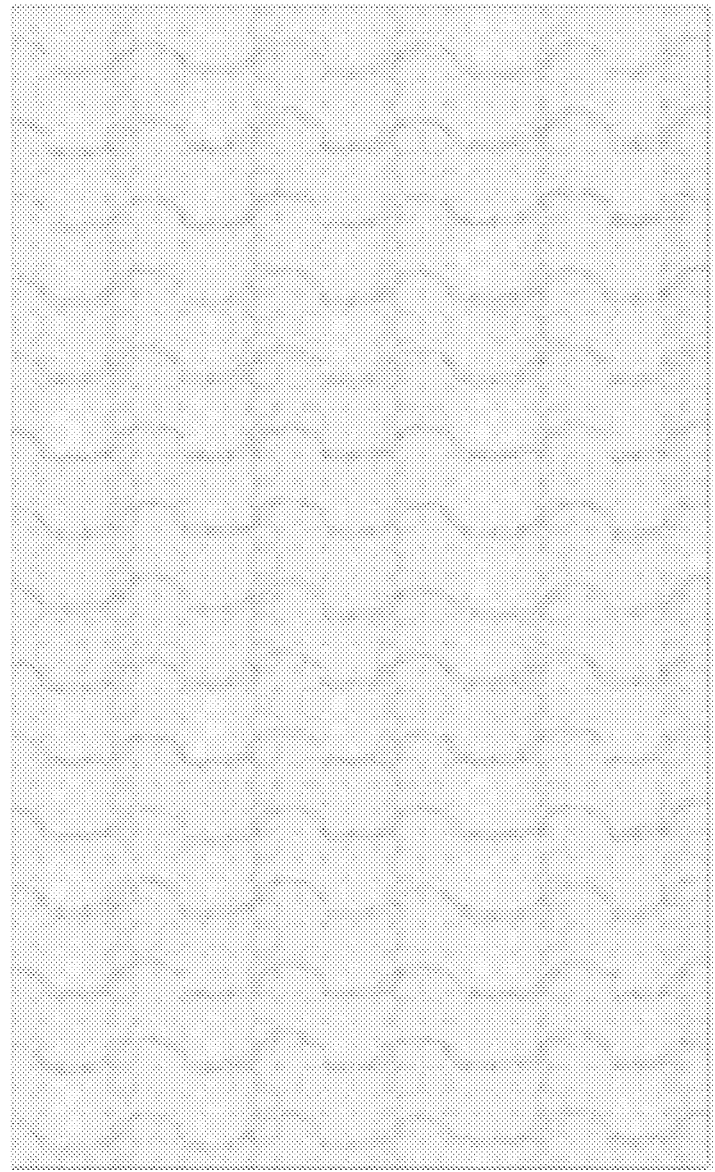
FIG. 13B is a schematic representation of the image of FIG. 13A after being modified into a visible yet substantially transparent format, according to one set of embodiments.
Figure 14:
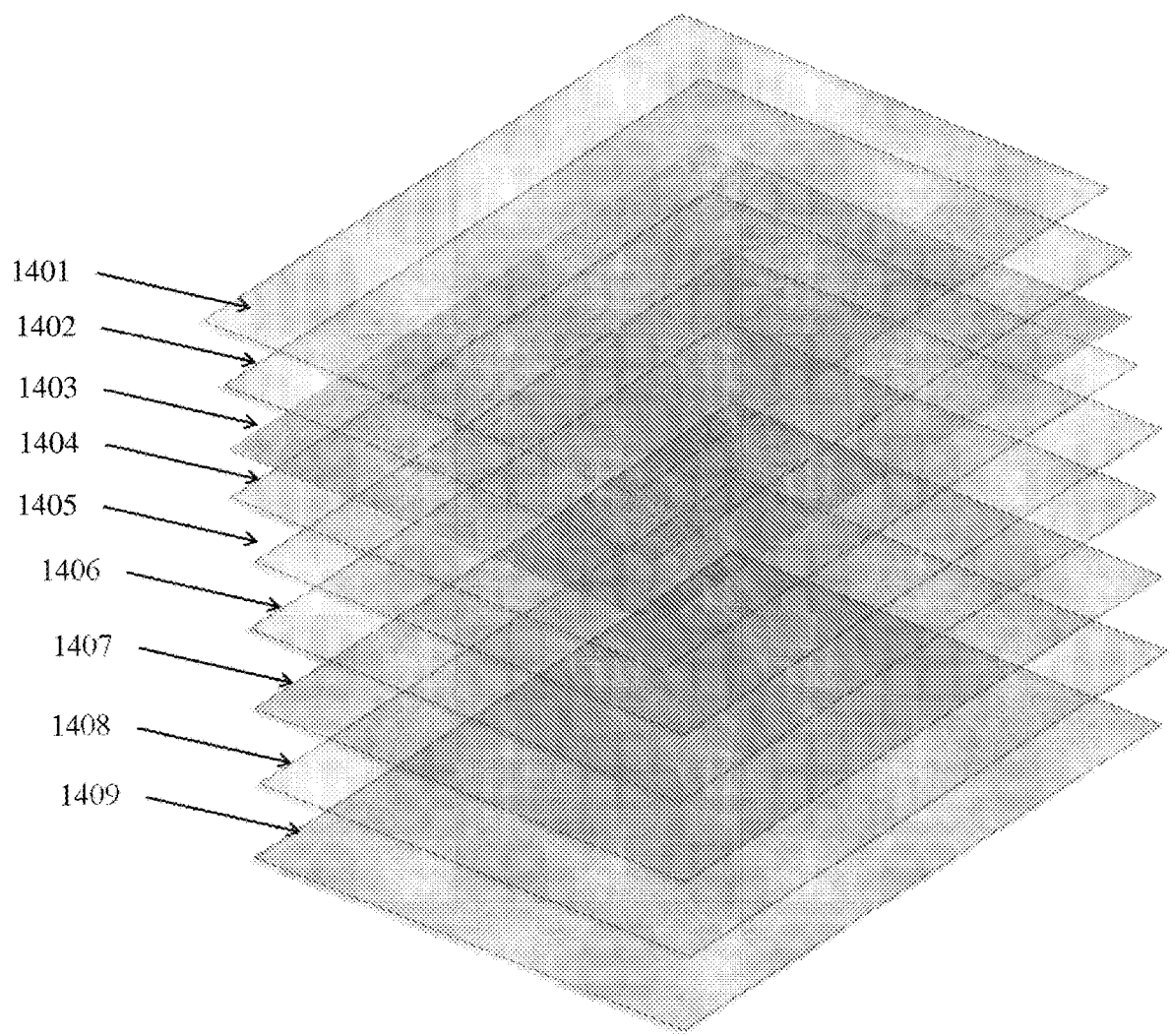
FIG. 14 is an exploded isometric schematic view of a photovoltaic module, according to one set of embodiments.
Figure 15:
FIG. 15 is an exemplary image of a photovoltaic module including a visible yet substantially transparent image of rooftop tiles, according to one set of embodiments.

The following example describes the fabrication of photovoltaic modules comprising a graphic layer, according to some embodiments.
Rooftop Tile Pattern FIG. 13A shows the raw image of rooftop tiles to be integrated into a solar panel. FIG. 13B shows the same image modified into substantially transparent format using the methodology outlined in Example 1. The image was modified to achieve a target transparency of 80% and target DPI of 12.61, to be printed over a total surface area of 18"×30", or 540 square inches. Accordingly, using the equations in Example 1, the isolated region radius was derived as 0.02 inches and the total number of isolated regions as 85,868. Subsequently, following the steps outlined in Example 1, a clipping mask was created in graphical algorithm editor, Grasshopper®, comprising 85,868 circles, each of radius 0.02 inches, arranged in a pattern of 321 columns and 535 rows, with neighboring columns and neighboring rows offset by 45 degrees and the neighboring circles in a row, as well as neighboring circles in a column, spaced apart 0.11212 inches, center to center. The clipping mask was placed over the image in FIG. 13A in image editing software, Adobe Illustrator®, and the image in FIG. 13B was created. This image was then printed with two coats of under print (base layers) and one coat of top image print (image layer) with a plurality of colors on clear vinyl (e.g., PowerGraphics Clear EcoCling vinyl) using a flatbed printer. To next integrate the vinyl with the image into a solar panel, the layers shown in FIG. 14 were arranged and laminated using the solar laminator. The layers were: (i) a top protective layer 1401—Madico's VueTek® transparent photovoltaic backsheet; (ii) temperature cured EVA (ethylene vinyl acetate) encapsulant layers 1402, 1404, 1406, 1408—STR's Photocap® 15585P HLTTM EVA photovoltaic encapsulating film; (iii) the vinyl with the image, 1403 (e.g., PowerGraphics Clear EcoCling vinyl); (iv) top cover of the solar photovlloltaic module, 1405—4 mm low-iron solar glass; (v) the photovoltaic cell matrix, 1407—monocrystalline solar cells electrically connected in series in a 3×5 matrix; (vi) protective backsheet, 1409—Madico's Protekt® charcoal/black photovoltaic backsheet. This lamination stack was placed in the solar laminator and allowed to bond together using a lamination procedure similar to the one used for conventional solar photovoltaic modules and known to those skilled in the art. After the lamination, the electrical leads from the photovoltaic cell matrix were encased in a junction box adhered to the underside of the module, as is typically done with conventional solar photovoltaic modules. Finally, aluminum frames were added to all four edges of the module, again as is typically done with conventional solar photovoltaic modules. The resultant solar photovoltaic module is shown in FIG. 15. The module's current-voltage characteristic ("IV curve") was plotted after subjecting it to the same flash simulation used to characterize conventional solar modules, and its power rating was established to be 36 W, which confirmed the expected 20% reduction from the nominal 45 W that would have been the module's power rating had it not been covered by the 20% opaque image print.
Company Logo—Microsoft's OneDrive™

Figure 16A:
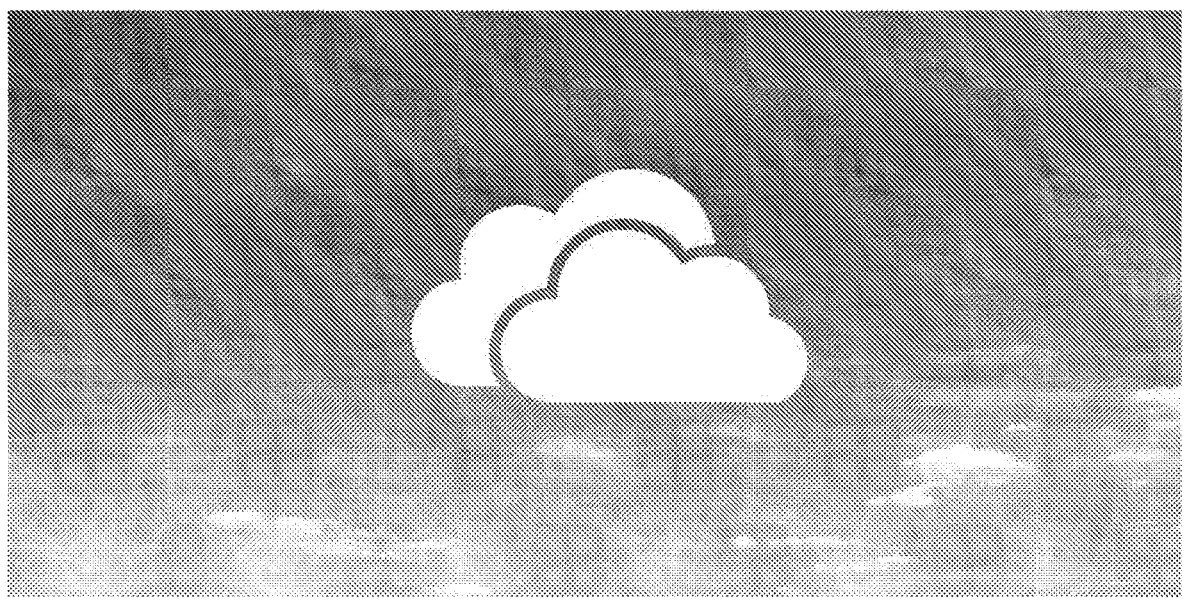
FIG. 16A is an exemplary image of a graphic containing a logo to be integrated into a solar panel, according to one set of embodiments.
Figure 16B:
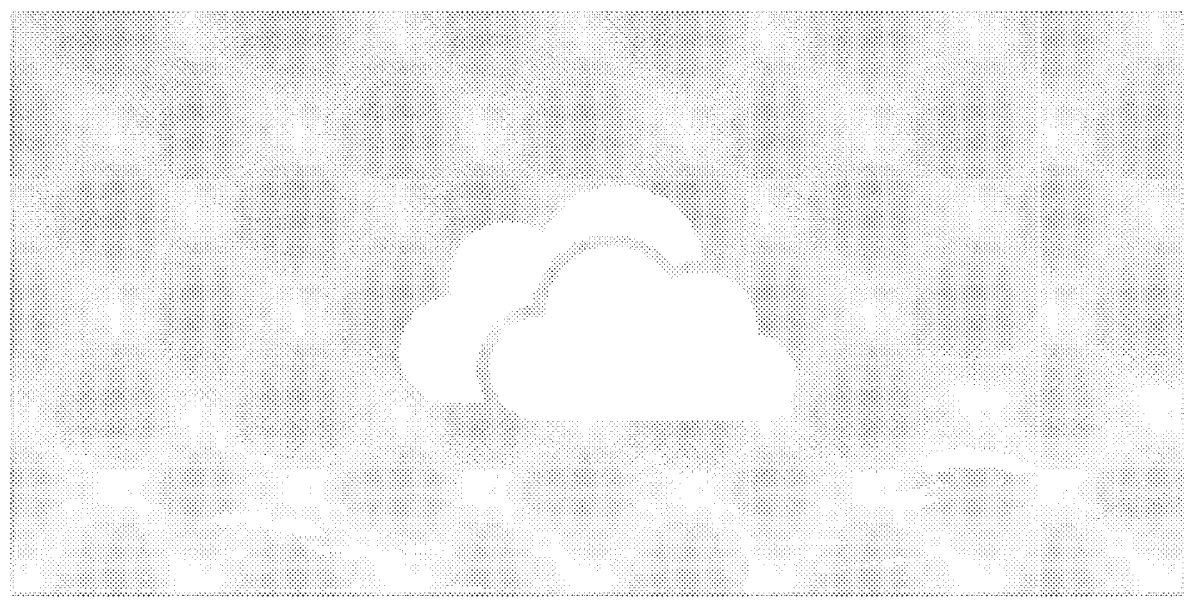
FIG. 16B is a schematic representation of the image of FIG. 16A after being modified into a visible yet substantially transparent format, according to one set of embodiments.
Figure 17:
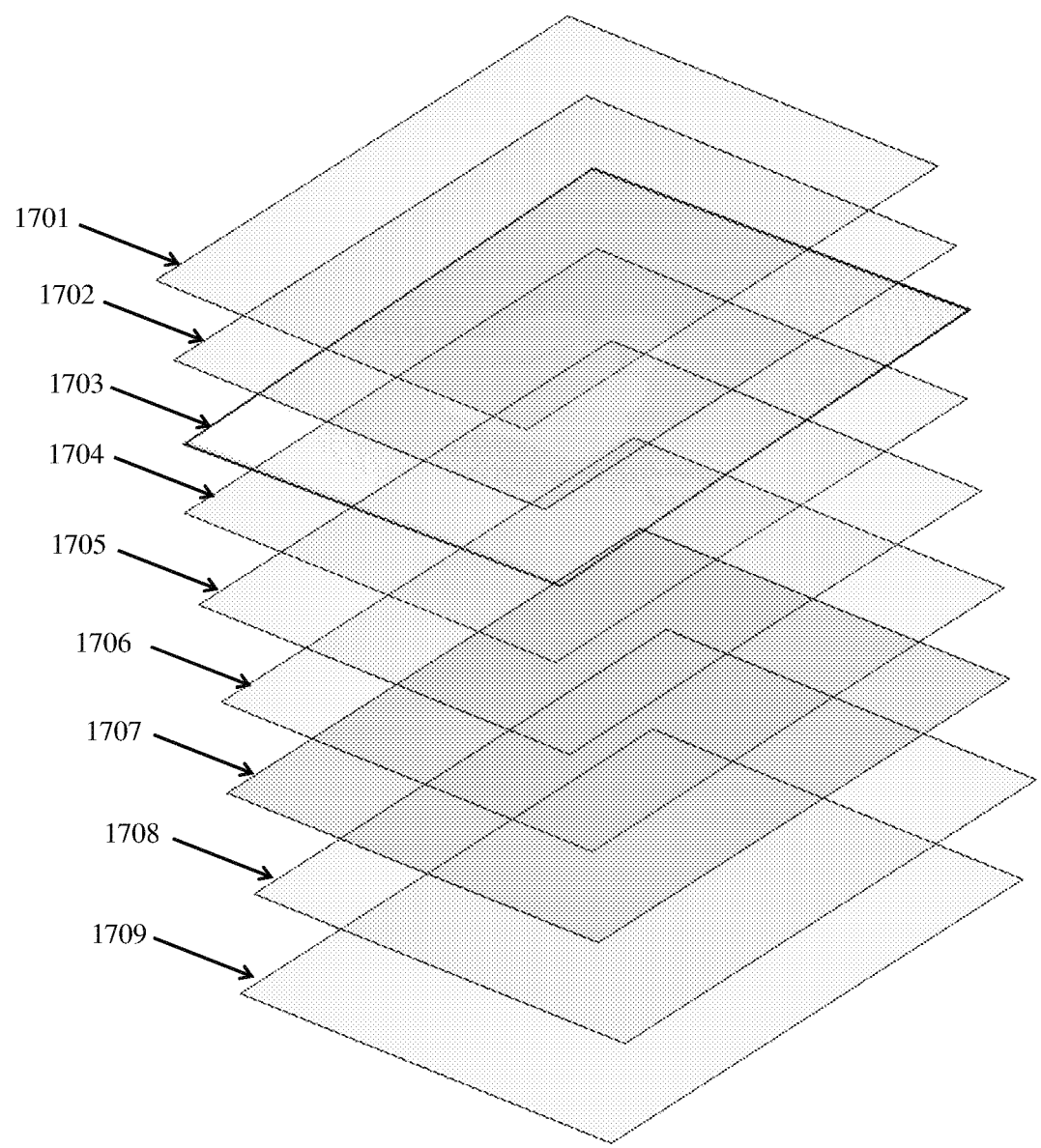
FIG. 17 is an exploded isometric schematic view of a photovoltaic module, according to one set of embodiments.
Figure 18:
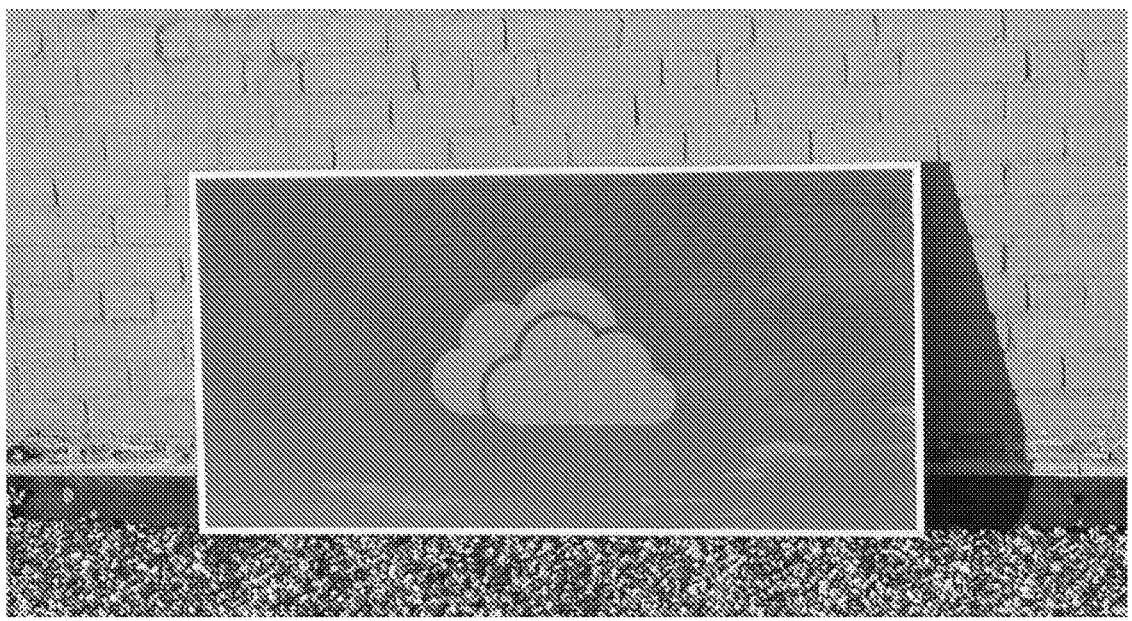
FIG. 18 is an exemplary image of a photovoltaic module including a visible yet substantially transparent image of a logo, according to one set of embodiments.

FIG. 16A shows the raw image of a graphic containing Microsoft's OneDrive™ logo to be integrated into a solar panel. FIG. 16B shows the same image modified into substantially transparent format using the methodology outlined in Example 1. The image was modified to achieve a target transparency of 80% and target DPI of ~12.59, to be printed over a total surface area of 25"×50", or 1250 square inches. Accordingly, using the equations in Example 1, the isolated region radius was derived as 0.02 inches and the total number of isolated regions as 198,248. Subsequently, following the steps outlined in Example 1, a clipping mask was created in graphical algorithm editor, Grasshopper®, comprising 198,248 circles, each of radius 0.02 inches, arranged in a pattern of 445 rows and 891 columns, with neighboring rows and neighboring columns offset by 45 degrees and the neighboring circles in a row, as well as neighboring circles in a column, spaced apart 0.11212 inches, center to center. The clipping mask was placed over the image in FIG. 16A in imaging editing software, Adobe Illustrator®, and the modified image in FIG. 16B was created. This image was then printed with two coats of under print (base layers) and one coat of top image print (image layer) on clear vinyl (e.g., PowerGraphics Clear EcoCling vinyl) using a flatbed printer. To next integrate the vinyl with the image into a solar panel, the layers shown in FIG. 17 were arranged and laminated using the solar laminator. The layers are: (i) a top protective layer 1701—Madico's VueTek® transparent photovoltaic backsheet; (ii) temperature cured EVA (ethylene vinyl acetate) encapsulant layers 1702, 1704, 1706, 1708—STR's Photocap® 15585P HLTTM EVA photovoltaic encapsulating film; (iii) the vinyl with the image, 1703 (e.g., PowerGraphics Clear EcoCling vinyl); (iv) top cover of the solar photovoltaic module, 1705—4 mm low-iron solar glass; (v) the photovoltaic cell matrix, 1707—monocrystalline solar cells electrically connected in series in a 4×9 matrix; (vi) protective backsheet, 1709—Madico's Protekt® charcoal/black photovoltaic backsheet. This lamination stack was placed in the solar laminator and allowed to bond together using a lamination procedure similar to the one used for conventional solar photovoltaic modules and known to those skilled in the art. After the lamination, the electrical leads from the photovoltaic cell matrix were encased in a junction box adhered to the underside of the module, as is typically done with conventional solar photovoltaic modules. Finally, aluminum frames were added to all four edges of the module, again as is typically done with conventional solar photovoltaic modules. The resultant solar photovoltaic module is shown in FIG. 18. The module's current-voltage characteristic ("IV curve") was plotted after subjecting it to the same flash simulation used to characterize conventional solar modules, and its power rating was established to be 86 W, which confirmed the expected 20% reduction from the nominal 108 W that would have been the module's power rating had it not been covered by the 20% opaque image print.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When the word "about" is used herein in reference to a number, it should be understood that still another embodiment of the invention includes that number not modified by the presence of the word "about."

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Any terms as used herein related to shape, orientation, alignment, and/or geometric relationship of or between, for example, one or more articles, structures, forces, fields, flows, directions/trajectories, and/or subcomponents thereof and/or combinations thereof and/or any other tangible or intangible elements not listed above amenable to characterization by such terms, unless otherwise defined or indicated, shall be understood to not require absolute conformance to a mathematical definition of such term, but, rather, shall be understood to indicate conformance to the mathematical definition of such term to the extent possible for the subject matter so characterized as would be understood by one skilled in the art most closely related to such subject matter. Examples of such terms related to shape, orientation, and/or geometric relationship include, but are not limited to terms descriptive of: shape—such as, round, square, circular/circle, rectangular/rectangle, triangular/triangle, cylindrical/cylinder, elipitical/elipse, (n)polygonal/(n)polygon, etc.; angular orientation—such as perpendicular, orthogonal, parallel, vertical, horizontal, collinear, etc.; contour and/or trajectory—such as, plane/planar, coplanar, hemispherical, semi-hemispherical, line/linear, hyperbolic, parabolic, flat, curved, straight, arcuate, sinusoidal, tangent/tangential, etc.; direction—such as, north, south, east, west, etc.; surface and/or bulk material properties and/or spatial/temporal resolution and/or distribution—such as, smooth, reflective, transparent, clear, opaque, rigid, impermeable, uniform(ly), inert, non-wettable, insoluble, steady, invariant, constant, homogeneous, etc.; as well as many others that would be apparent to those skilled in the relevant arts. As one example, a fabricated article that would described herein as being "square" would not require such article to have faces or sides that are perfectly planar or linear and that intersect at angles of exactly 90 degrees (indeed, such an article can only exist as a mathematical abstraction), but rather, the shape of such article should be interpreted as approximating a "square," as defined mathematically, to an extent typically achievable and achieved for the recited fabrication technique as would be understood by those skilled in the art or as specifically described. As another example, two or more fabricated articles that would described herein as being "aligned" would not require such articles to have faces or sides that are perfectly aligned (indeed, such an article can only exist as a mathematical abstraction), but rather, the arrangement of such articles should be interpreted as approximating "aligned," as defined mathematically, to an extent typically achievable and achieved for the recited fabrication technique as would be understood by those skilled in the art or as specifically described.

What is claimed is:

1. A graphic layer formed of a unitary sheet for covering substantially all of a light-incident surface of a photovoltaic layer of a photovoltaic module and for depicting a visible representation of an image along a surface of the photovoltaic module, the graphic layer comprising:
    a plurality of substantially opaque isolated regions bearing portions of the image and being distributed across the graphic layer, the opaque isolated regions having a largest cross-sectional dimension that is about 1000 microns to about 5080 microns,
    wherein:
    the substantially opaque isolated regions are offset, by an angle that is about 30 degrees to about 60 degrees, from other adjacent neighboring substantially opaque regions that are closest when measured by a distance between geometric centers of the substantially opaque isolated regions;
    at least a portion of the isolated regions comprise a base layer and an image layer, the base layer comprising a substantially white layer, wherein a ratio of an average thickness of the base layer to an average thickness of the image layer is about 4:1 to about 1:2, and a ratio of the width of the base layer to the width of the image layer is about 0.9:1 to about 1.1:1;
    the substantially opaque isolated regions occupy a surface area of less than about 50% of the surface area of the graphic layer and together form the visible representation of the image; and
    a substantially transparent contiguous layer along which the substantially opaque isolated regions are disposed, the substantially transparent contiguous layer covering the photovoltaic layer between the substantially opaque isolated regions.

2. The graphic layer of claim 1 wherein the substantially opaque isolated regions have a largest cross-sectional dimension of about 3000 microns to about 4000 microns.

3. The graphic layer of claim 1 wherein the offset angle is about 45 degrees.

4. The graphic layer of claim 1 wherein an average shortest distance between perimeters of neighboring substantially opaque isolated regions is less than or equal to about 4 times an average largest cross-sectional dimension of the substantially opaque isolated regions.

5. The graphic layer of claim 1 wherein an average shortest distance between perimeters of neighboring substantially opaque isolated regions is greater than or equal to about 0.98 times an average largest cross-sectional dimension of the substantially opaque isolated regions.

6. The graphic layer of claim 1 wherein the ratio of the average thickness of the base layer to the average thickness of the image layer is about 2:1.

7. The graphic layer of claim 1 wherein the isolated regions are substantially elliptical.

8. The graphic layer of claim 1 wherein the isolated regions are substantially circular.

9. The graphic layer of claim 1 wherein the isolated regions are substantially polygonal shaped.

10. The graphic layer of claim 1 wherein the substantially opaque isolated regions occupy a surface area of less than about 30% of the surface area of the graphic layer.

11. The graphic layer of claim 1 wherein the substantially opaque isolated regions occupy a surface area of less than about 20% of the surface area of the graphic layer.

12. The graphic layer of claim 1 wherein the substantially opaque isolated regions occupy a surface area of less than about 10% of the surface area of the graphic layer.

13. The graphic layer of claim 1 wherein the substantially opaque isolated regions occupy a surface area of less than about 5% of the surface area of the graphic layer.

14. The graphic layer of claim 1 wherein the graphic layer substantially covers an entire front surface of the photovoltaic module.

15. The graphic layer of claim 1 wherein the substantially opaque isolated regions are distributed substantially evenly along the entire graphic layer.

16. The graphic layer of claim 1 wherein at least a portion of the substantially opaque isolated regions are offset from adjacent columns of neighboring substantially opaque regions by an offset angle that is about 30 degrees to about 60 degrees from an axis along which columns of substantially opaque regions are disposed.

17. The graphic layer of claim 1 wherein the substantially transparent contiguous region comprises a transparent decal layer and the substantially opaque isolated regions are disposed on a surface of the transparent decal layer.

18. The graphic layer of claim 17 wherein the surface of the transparent decal layer is an adhesive layer.

19. The graphic layer of claim 1 wherein the graphic layer is a layer applied to an external surface of the photovoltaic module.

* * * * *